US006791311B2

(12) United States Patent
Murphy et al.

(10) Patent No.: US 6,791,311 B2
(45) Date of Patent: Sep. 14, 2004

(54) LIGHTNING DETECTION AND DATA ACQUISITION SYSTEM

(75) Inventors: Martin J. Murphy, Tucson, AZ (US); Kenneth L. Cummins, Tucson, AZ (US); Alburt E. Pifer, Tucson, AZ (US)

(73) Assignee: Vaisala Oyj, Helsinki (FI)

( * ) Notice: Subject to any disclaimer, the term of this patent is extended or adjusted under 35 U.S.C. 154(b) by 0 days.

(21) Appl. No.: 10/075,055

(22) Filed: Feb. 13, 2002

(65) Prior Publication Data

US 2003/0151398 A1 Aug. 14, 2003

(51) Int. Cl.[7] .................. G01R 31/02; G01W 1/00; G01S 3/32
(52) U.S. Cl. .................. 324/72; 324/76.33; 702/4; 342/460
(58) Field of Search .................. 324/72, 76.11, 324/76.33; 702/4, 59, 66; 342/460, 465; 73/170.24

(56) References Cited

U.S. PATENT DOCUMENTS

| 4,115,732 A | 9/1978 | Krider et al. |
| 4,198,599 A | 4/1980 | Krider et al. |
| 4,245,190 A | 1/1981 | Krider et al. |
| 4,543,580 A | 9/1985 | Bent et al. |
| 4,792,806 A | 12/1988 | Bent et al. |
| 4,906,995 A * | 3/1990 | Swanson ............... 341/95 |
| 4,914,444 A * | 4/1990 | Pifer et al. ........... 342/460 |
| 5,140,523 A * | 8/1992 | Frankel et al. ......... 702/4 |
| 5,295,071 A * | 3/1994 | Kuzma et al. .......... 702/4 |
| 5,537,318 A | 7/1996 | Moses et al. |
| 5,699,245 A * | 12/1997 | Herold ................ 702/4 |
| 6,164,130 A * | 12/2000 | Pabst et al. .......... 73/170.24 |
| 6,215,294 B1 | 4/2001 | Coleman |
| 6,246,367 B1 | 6/2001 | Markson et al. |
| 6,492,929 B1 * | 12/2002 | Coffey et al. .......... 341/155 |

OTHER PUBLICATIONS

Kenneth et al. "The US National Lightning Detection NetworkTM and applications of cloud–to–ground lightning data by lectric power utilites", Electromagnetic Compatibility, IEEE Transactions, vol.: 40 Issue: 4 Nov. 1998, pp.: 465–480.*

* cited by examiner

Primary Examiner—Anjan K. Deb
(74) Attorney, Agent, or Firm—Birdwell & Janke, LLP

(57) ABSTRACT

A lightning detection and data acquisition system. A plurality of remote programmable sensor is utilized to detect cloud to ground and IC lightning strikes. Analog representations of the lightning strikes are converted to digital signals. The digital signals are classified according to user changeable criteria. The classified digital signals are compressed and optionally decimated. The compressed information is transmitted to a central location where it is decompressed and used to correlate the location, magnitude, and travel path of the detected lightning strikes.

48 Claims, 29 Drawing Sheets

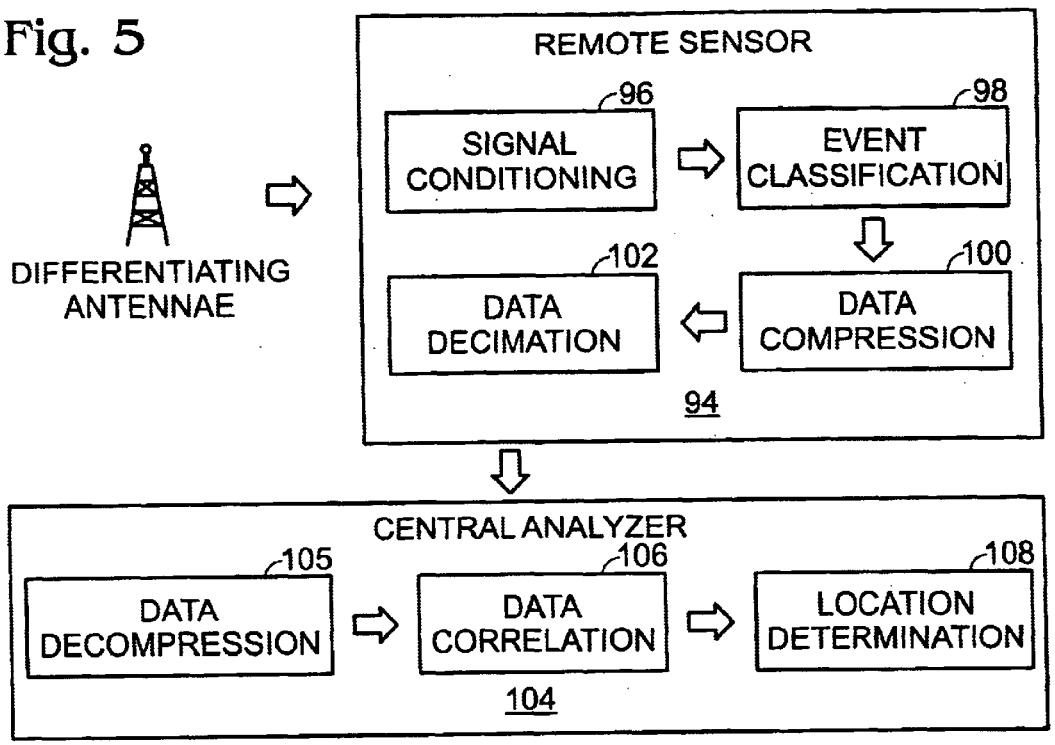
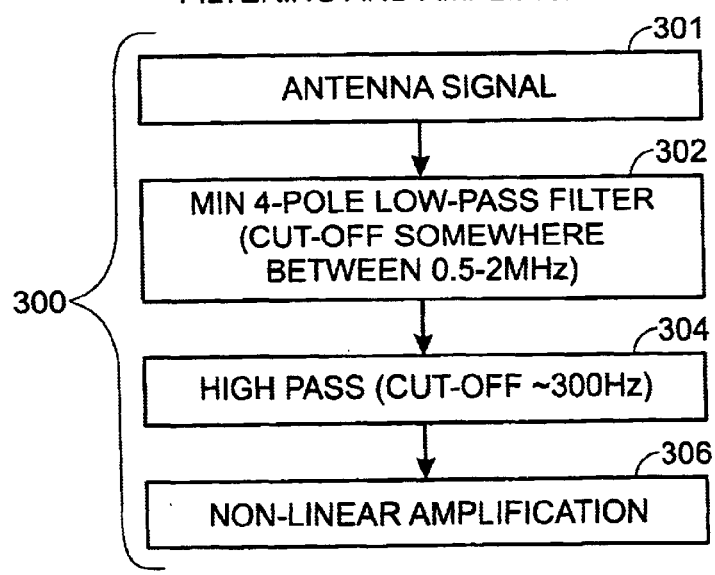

Fig. 16

| PULSE | TIME (FRAC. OF SEC.) | TIME (MICROSECONDS) | AMPLITUDE (COUNT) |
|---|---|---|---|
| 1 | 0.000500 | 500 | 4400 |
| 2 | 0.000630 | 630 | 5100 |
| 3 | 0.000800 | 800 | 2900 |
| 4 | 0.000840 | 840 | 5000 |
| 5 | 0.000990 | 990 | 2900 |
| 6 | 0.001060 | 1060 | 2500 |

Fig. 17

| COMPLETE REPRESENTATIONS | DECIMAL | HEXADECIMAL |
|---|---|---|
| PULSE1 TIME (TO SECOND): | 997056000 | 3B6DDE00 |
| FRACTION OF SECOND: | 10000 | 2710 |
| AMPLITUDE: | 4400 | 1130 |
| ANGLE: | 359.99° | 7FFF |
| CLASSIFICATION: | CLOUD | 1 |

Fig. 18

```
HEX:  3    B    6    D    D    E    0    0
BIN: 0011 1011 0110 1101 1101 1110 0000 0000
COMMENT: ←――――――TIME TO THE SECOND――――――→
```

```
HEX:  0    0    8    9    C    5    3
BIN: 0000 0000 0001 1000 1001 1100 0101 0011
COMMENT: ←FRACTION OF SECOND―→ ←AMPLITUDE
```
FLAG TO INDICATE THAT AMPLITUDES ARE INCLUDED

```
HEX:  E    C    F    F    F    F
BIN: 0011 1100 1111 1111 1111 1111
COMMENT: AMPLITUDE→ ←――ANGLE――→ ←CLASSIFICATION
                                  (1=CLOUD;
                                   0=CG)
```

```
       502
        ↘
  HEX:   D    7    6    7    5    E   500
                                        ↙  PULSE 1
  BIN: 0011 0111 0110 0111 0101 1110
502
  ↘HEX:  3    5    2    6    3    8   500
                                        ↙  PULSE 3
  BIN: 0011 1101 0010 0110 0011 1000
502
  ↘HEX:  0    C    8    7    D    4   500
                                        ↙  PULSE 4
  BIN: 0000 1100 1000 0111 1101 0100
502
  ↘HEX:  2    E    E    6    3    8   500
                                        ↙  PULSE 5
  BIN: 0010 1110 1110 0110 0011 1000
502
  ↘HEX:  1    5    E    5    E    A   500
                                        ↙  PULSE 6
  BIN: 0001 0101 1110 0101 1110 1010
       TIME DIFFERENCES    AMPLITUDE FRACTIONS
          13 BITS          ↑
                       CLASSIFICATION
```

| | SENSOR1 | SENSOR2 | SENSOR3 | SENSOR4 |
|---|---|---|---|---|
| DECREASING MAGNITUDE ↓ | 1H | 2F | 3C | 4B |
| | 1J | 2C | 3D | 4C |
| | 1E | 2G | 3A | 4A |
| | 1G | 2E | 3B | |
| | 1B | 2A | | |
| | 1L | 2H | | |
| | 1D | 2B | | |
| | 1F | 2D | | |
| | 1A | | | |
| | 1C | | | |
| | 1I | | | |
| | 1K | | | |
| | 1M | | | |

LIGHTNING DETECTION AND DATA ACQUISITION SYSTEM

BACKGROUND OF THE INVENTION

This invention relates to lightning detection and data acquisition systems, and in particular to systems that provide continuous lightning detection and are programmable to allow for user-selectable evaluation criteria.

Lightning detection and data acquisition systems are used to detect the occurrence and determine the location of lightning discharges, and gather other data about the discharges. In traditional lightning detection systems, a plurality of sensors are placed tens to hundreds of kilometers apart to remotely detect the electric and magnetic fields of lightning discharges. Such discharges may be between a cloud and the ground ("CG") or within a cloud ("IC"). Information from the sensors is transmitted to a central location, where analysis of the sensor data is performed. Typically, at least the time of occurrence and location of the discharges are determined from data provided by a plurality of sensors.

Remote sensors of lightning detection and data acquisition systems typically detect electric and magnetic fields of both CG and IC lightning flashes, which are composed of many discharges. It is often important to be able to distinguish between the two types of flashes. To that end, remote sensors often look at the low-frequency ("LF") and very-low-frequency ("VLF") emissions from lightning discharges. The electrical signals produced by LF and VLF ("LF/VLF") detectors are ordinarily integrated prior to analysis to produce a waveform representation of the electric or magnetic discharge field, as the antenna inherently responds to the time derivative of the field. Analyzing signals representative of either an electric or magnetic field to distinguish CG and IC discharges is referred to as performing waveform analysis. There are several criteria for distinguishing between CG and IC events. One well known method for distinguishing lighting signals both in the LF and in the VLF range is to examine the time that passes from a peak in a representative signal to the instant it crosses a zero amplitude reference point. This is referred to as a peak-to-zero ("PTZ") method of analysis. A relatively short PTZ time is a good indication that an IC discharge has occurred. Another well known method of distinguishment is referred to as a bipolar test wherein the representative signal is examind for a first peak and a subsequent peak of opposite polar which is greater than a predetermined fraction of the first peaks. Such an occurrence is another good indication of an IC discharge. Yet another test for IC discharges is the presence of subsequent peaks of the same polarity in a representative signal greater than the initial peak. This is predicated on the fact that some IC discharges have a number of small and fast leading electromagnetic pulses prior to a subsequent larger and slower pulse. In the absence of such criteria indicating that the discharge is an IC discharge, it is ordinarily assumed to be a CG discharge. Even with the application of all established criterion for distinguishing between CG and IC events, some events are still misclassified.

An alternative method of lightning detection is to monitor very high frequency ("VHF") radiation from lightning discharges. However, VHF detection systems must be able to process information at extremely high data rates, as VHF pulse emissions in IC lightning occur approximately one tenth of a millisecond apart. Additionally, VHF systems can only detect lightning events that have direct line of sight to the sensor. One such system is currently in use by NASA at Kennedy Space Center in Florida However, this system is further restricted to line of sight between the sensors and the central analyzer as it uses a real-time microwave communication system. Additionally, the VHF system in use by NASA has proven to be expensive to install and maintain.

Previous lightning detection and data acquisition systems for detecting low frequency electric field signals have been designed around a combination of two location methods, time-of-arrival ("TOA") and magnetic direction finding, with time-domain field waveform analysis. In most of these systems, the sensors are predominately analog devices. Using analog devices in lightning sensors requires the utilization of "track and hold" circuits to detect a quailing event, capture a representative signal, and perform waveform analysis on it. Due to an accumulation of delay periods in these "track and hold" circuits, these sensors have a large "re-arm" time, or "dead-time", during which the sensors do not record subsequent lightning events. Even more modern lightning detection and data acquisition systems that are substantially digital have some dead time. For example, the sensors in some such systems have a "dead-time" of 5 to 10 milliseconds, and even the most current digital sensors have a "dead-time" of up to one millisecond. The latter are capable of detecting only a limited fraction of IC lightning discharges. This is due in part to the fact that several IC lightning discharges could occur in a single millisecond. CG lightning flashes, however tend to have fewer discharges with relatively large periods of times between individual discharges. If a previous generation sensor is designed to monitor both CG and IC electric field signals, a significant portion of time is occupied processing IC discharge events at the expense of recording CG events. Another aspect associated with sensor dead times and the TOA location method is the uncertainty in assuring that multiple remote sensors will respond to the same IC lightning event. Due to attenuation suffered by electromagnetic waves as they travel long distances over the earth, remote small amplitude events become difficult to detect. If different sensors produce time-of-arrival information from different events, the computed discharge location will have significant error.

Analog sensors operating at LF/VLF frequencies are difficult to tune for both CG and IC lightning discharges. The median amplitude of a CG field signal is about an order of magnitude greater than the median amplitude of an IC field signal. Optimizing the gain of one of these sensors to detect IC events often causes the sensor to become saturated with the much greater energy of nearby CG lightning discharges. Therefore, it is customary to adjust the gain to accommodate both types of field signals, reducing a sensor's ability to detect IC events. As distant IC lightning discharges become attenuated by propagation over the ground, they become difficult to distinguish from background environmental noise.

In order for the lightning detection system to provide useful information in a timely manner, there must exist a method of transmitting sensor information to a central location. This central location must collect information from numerous remote sensors which is then correlated to establish the location, magnitude, and time of occurrence of lightning discharges. Existing detection systems generally have low-bandwidth communication systems, limiting the amount of information that a sensor can transmit to the central analyzer. In many existing lightning detection networks, the sensors are connected to a central location by low-speed telephone modems, usually 2400 to 9600 bits per second. In the past, this communication restriction was not overly critical, as the large dead-time of previous generation analog sensors limited the amount of information that could be collected and sent to the central analyzer.

Once the sensor information arrives at a central location, it must be analyzed. The information from each sensor is compared against incoming information from other sensors. This correlation process attempts to find corresponding data to determine the location, magnitude, and time of occurrence of lightning discharges. However, current correlation techniques are not sufficient to handle large amounts of information when the time between discharges is more than an order of magnitude shorter than the travel time between sensors. In fact, if a lightning detection system made use of advanced technologies to transmit and receive an increased amount of information, current central analyzers would be unable to process the information efficiently with current correlation techniques.

The state of the art of lightning detection and data acquisition systems is generally represented, in part, by several patents. First, Krider et al. U.S. Pat. Nos. 4,198,599 and 4,245,190 describe a network of gated wideband magnetic direction finding sensors. These sensors are sensitive to return strokes in CG lightning flashes. In U.S. Pat. No. 4,198,599, discrimination and classification is accomplished by examining the shape of the time-domain field waveform. A short rise time (time from threshold to peak) results in a representative signal being placed in an analog track and hold circuit while further analysis is performed. These sensors are designed with CG discharges being of primary interest. Any IC lightning discharges that are detected are discarded. However, both CG and IC events that meet the short rise time criteria and a simple test of event duration result in a significant amount of sensor dead-time.

Second, Bent et al. U.S. Pat. Nos. 4,543,580 and 4,792,806 disclose networks of sensors that measure TOA of electric field signals and employ this information to locate lightning. These sensors do not discriminate between IC and CG discharges. However, these sensors suffer the similar dead time issue as the magnetic direction sensors of the Krider patents. When a number of IC discharge pulses occur in a short time, there is no assurance that multiple sensors will respond to same IC discharge event.

Another patent of interest is Markson et al. U.S. Pat. No. 6,246,367 wherein a lightning detection system utilizes an analog-to-digital converter ("ADC") to provide continuous processing of representative field signals. This eliminates the dead time issue inherent in previous generation sensors. Markson describes using a bipolar comparator to distinguish between positive and negative polarity versions of a particular pulse that is inferred to be the first broadband radiation pulse in either a CG or an IC flash. Markson also uses a data correlation process and time-of-arrival difference location method. Markson explicitly uses a high pass filter to block most low frequency components of representative field signals, which are not necessarily useful for detecting the initial pulse in the flash. Limitations of the Markson patent are the specific use of the HF frequency range and detection and processing of only the first pulse in each flash.

Accordingly, there has been a need for improvement of lightning detection and data acquisition systems in several respects. First, an improved signal conditioning method is needed. CG events are normally an order of magnitude larger than IC events at LF, due to the channel length and amount of current which flows during a CG return stroke. As mentioned previously, increasing the gain, or equivalently reducing the event threshold, results in CG events saturating an analog detection and evaluation system or the pick-up of significant amounts of noise. Reducing the gain, or equivalently increasing the event threshold, results in inefficient detection that masks IC events. There is a need to reduce the effect of this magnitude difference between CG and IC signals while removing unwanted noise components. An interesting aspect of both electric field and magnetic field antennae is that they produce a signal which is proportional to the time derivative of the electromagnetic field they are detecting. These differentiating antennae actually reduce the magnitude disparity between IC and CG differential representative signals. However, current generation sensors invariably impose integration methods to convert the differentiated field signal to one representative of the electromagnetic field without making use of the fact that the antenna itself reduces dynamic range requirements. Additionally, there is a need for an improved classification method for distinguishing between lightning types.

Another need in the industry is the ability to program remote sensors with new or different waveform analysis techniques. There is also a need for improved data compression and data decimation techniques to accommodate more IC as well as CG information. Additionally, new data correlation techniques are needed to handle increased information processing rates. These correlation techniques need to handle both time-of-arrival and direction information.

Thus, a need exists for a complete lightning detection and data acquisition system that combines new methods of signal conditioning, a user changeable system for event classification, new methods of data compression, and new data correlation techniques to efficiently detect CG and IC events and determine their location, magnitude, and time of occurrence.

SUMMARY OF THE INVENTION

The present invention meets the aforementioned needs by utilizing a plurality of remote programmable sensors (RPS) disposed in different geographic locations to detect, classify, package, and transmit in compressed form information regarding both CG and IC lightning discharges. The information is collected at a central analyzer location where it is decompressed and correlated in order to determine the location, magnitude, and time of occurrence of the lightning discharges. An antenna designed to detect the electromagnetic field signal from a lightning discharge and produce a derivative representative field signal is used. The derivative signal has the benefit of reducing the amplitude disparity between CG and IC field signals. A filter is used to increase the signal to noise ratio by passing the low frequency portions of the differentiated signal while discarding high frequency noise without integrating the principal components of the signal. Non-linear amplification further reduces the amplitude disparity between CG and IC signals by providing greater amplification for lower amplitude signals. The amplified signals are then processed by an ADC to convert an amplified differential signal into a digital representation. This conversion allows a signal to be processed and stored digitally. The digital representation is then integrated by a digital processor to provide a signal representative of the electric or magnetic field. The digital differentiated field signal and the digital signal representative of the field itself are used by the digital processor to classify the lightning event as either a CG or IC event. The analog-to-digital conversion coupled with digital storage permits continuous detection and evaluation of lightning discharges, which eliminates the "dead time" inherent in previous generation lightning detection systems.

The present invention uses a novel data compression process to transmit data over low bandwidth communication channels. Numerous digital signal pulses representative of lightning discharges are grouped together in pulse trains. The largest pulse is designated as the reference pulse and its amplitude, time, and direction (if available) are included in a data record. Other pulses in the pulse train are represented by a fractional amplitude of the reference pulse and a time-stamp relative to the time of the preceding or following pulse. This greatly reduces the information that must be transmitted to define all the pulses in the pulse train accurately. If the amount of transmitted information still exceeds the bandwidth of an associated communications channel then the RPS sensors in the lightning detection system can be programmed to transmit synchronized portions of the information, so that all sensors will report information about the same lightning events.

Once received by the central analyzer, the information is unpacked and the original pulse amplitude, time, and direction (if available) information is reconstructed. The unpacked pulse information is used to correlate lightning strike information from a plurality of sensor locations. This information is used to determine the magnitude, location, and time of occurrence of the lightning discharge.

Accordingly, it is a principal object of the present invention to provide a novel and improved lightning detection and data acquisition system and method.

It is another object of the present invention to provide a lightning detection and data acquisition system and method with improved capability of distinguishing CG and IC lightning events.

It is a further object of the present invention to provide a lightning detection and data acquisition system that reduces the amplitude disparity between CG and IC lightning representative field signals.

It is an additional object of the present invention to provide a lightning detection and data acquisition system and method that provides continuous detection and processing of electromagnetic field signals caused by lightning discharges.

It is yet another object of the present invention to provide a lightning detection and data acquisition system and method for compression, decimation, and transmission of digital representations of lightning electromagnetic field signals.

It is yet a further object of the present invention to provide a lightning detection and data acquisition system and method for improved correlation of information from a plurality of remote programmable sensors to determine the location, magnitude, and time of occurrence of lightning strikes.

It is a further object of the invention to provide a lightning detection and data acquisition system in which the configuration of the sensors may be set or altered by remote access.

The foregoing and other objects, features, and advantages of the invention will be more readily understood upon consideration of the following detailed description of the invention, taken in conjunction with the accompanying drawings.

BRIEF DESCRIPTION OF THE DRAWINGS

FIG. 5 is a functional block diagram of a preferred embodiment of a lightning detection and data acquisition system according to the present invention.

FIG. 7 is a block diagram of an antenna filter network according to the present invention.

FIG. 16 is a table depicting the time and amplitude of six electromagnetic pulses which, cumulatively, form a pulse train.

FIG. 17 is a table showing decimal and hexadecimal representations of the first pulse of FIG. 16.

FIG. 18 illustrates binary and hexadecimal representations of the largest pulse of FIG. 16 compressed according to the invention.

DETAILED DESCRIPTION OF THE INVENTION

Figure 1:
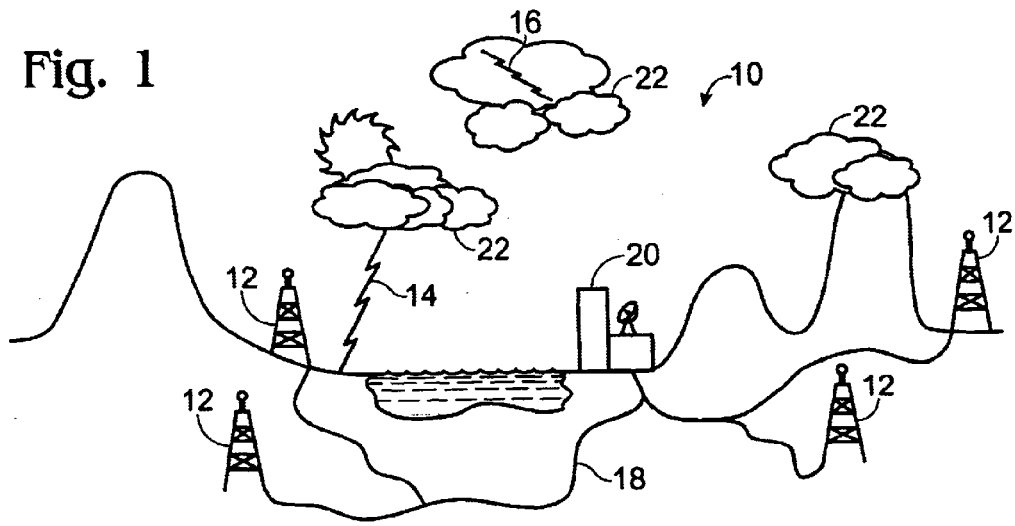
FIG. 1 is an illustration of the physical arrangement of an exemplary system for acquiring data about cloud-to-ground and intra-cloud discharges according to the present invention.

Referring to FIG. 1, a preferred embodiment of the lightning detection and data acquisition system 10 is illustrated. Remote Programmable Sensors ("RPS") 12 are distributed tens to hundreds of kilometers apart. The remote sensors are used to detect electromagnetic fields generated by lightning discharges from clouds 22 as either CG lightning 14 or IC lightning 16. Communication link 18 allows the remote sensors 12 to send information to a central analyzer 20, where the locations, magnitudes, and times of occurrence of the lightning discharges are determined.

CG lightning discharges are generally ten times larger in magnitude than IC events in the VLF/LF frequency range. To prevent saturation of the analog components of the remote sensor 12, a means for reducing the amplitude disparity between CG representative signals and IC representative signals is provided. The sensors 12 also possess a means for increasing the signal-to-noise ratio of the representative signals. Additionally, the sensors 12 convert the analog representative signals into digital signals which are then classified as either CG or IC lightning. Once the signals have been classified, the sensor determines whether groups of signals are sufficiently close together in time to be considered a train of pulses. For such pulse trains, the sensor packages the signal information into compressed data words and transmits the data words to the central analyzer 20. Isolated pulses are transmitted alone with a richer set of characterizing features. If the communication link is insufficient to handle all the information, then the remote sensor 12 decimates the information, only sending synchronous portions of the information.

The central analyzer 20 is used to receive the data words sent from the remote sensors 12 and decompress the words to obtain the lightning discharge information. Applying correlation techniques, the information from a plurality of sensors 12 is used to determine the magnitude, location, and time of occurrence of lightning discharges 14, 16.

Figure 2:
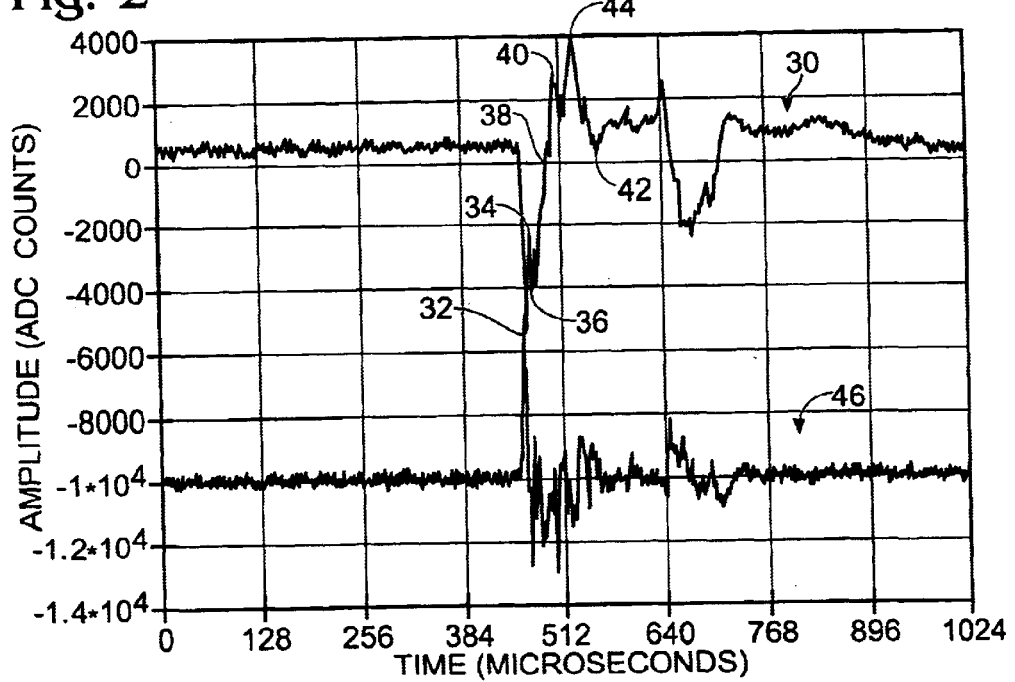
FIG. 2 is an illustration of a typical LF/VLF field waveform and corresponding time derivative waveform produced by a cloud-to-ground discharge.

Lightning flashes occur between opposite polarity charge accumulations. The lightning flash begins with small breakdown events as the air between the charge accumulations is ionized, forming conducting channels. In a CG flash, once a channel has been formed from the cloud to the ground, large amounts of current flow between the cloud and the ground. The discharges carrying these large current flows are called return strokes. A typical CG lightning flash will have four return strokes. These strokes are typically tens of milliseconds apart. A waveform 30 of the field generated by a CG stroke is shown in FIG. 2. This figure illustrates an electromagnetic pulse with a first negative peak 32, a first negative trough 34, a second negative peak 36, a zero crossing point 38, a first positive peak 40, a first positive trough 42, and a second positive peak 44. A second signal 46 demonstrates the electrical signal representative of the field wave after detection by an antenna 12 which is responsive to the time derivative of the field.

Figure 3:
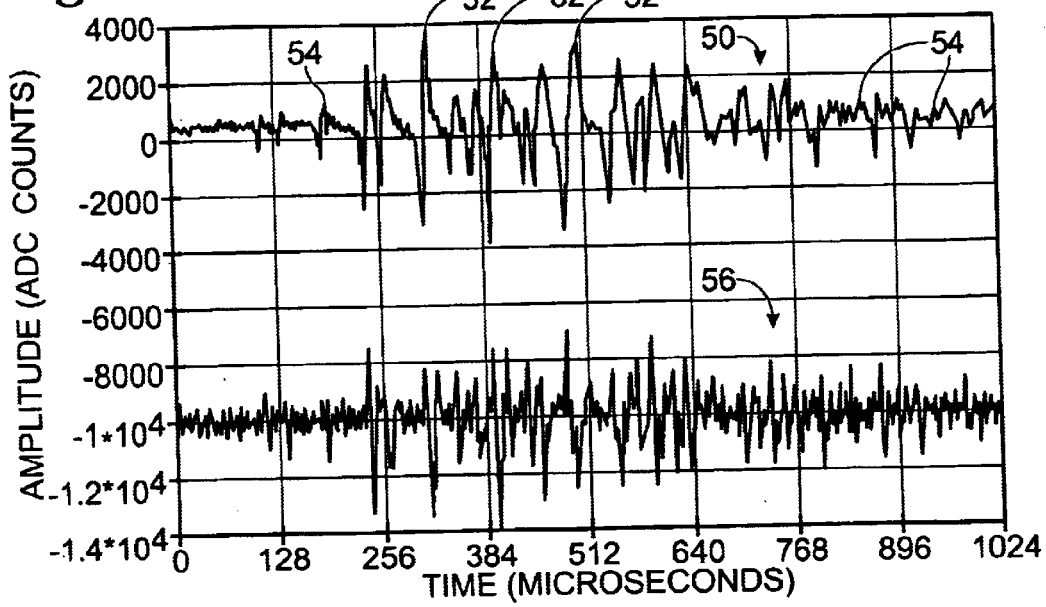
FIG. 3 is an illustration of a typical LF/VLF field waveform and corresponding time derivative waveform produced by an IC discharge.

The number of discharges in an IC flash is approximately ten times greater than the number of strokes in a CG flash. On the other hand, the median amplitude of electromagnetic fields caused by CG lightning strokes is approximately ten times greater than that caused by IC discharges. The time spacing between pulses in an IC discharges is also much less than for CG lightning. The result is that IC discharges often occur as pulse trains. The largest amplitude electromagnetic field pulse generally occurs in the middle of these pulse trains. A waveform 50 of the field generated by an IC discharge is shown in FIG. 3. This figure illustrates an electromagnetic field pulse train made up of numerous prominent pulses 52 and several small to moderate pulses 54. A second signal waveform 56 demonstrates the electrical signal representative of the time derivative of the field after detection by the (differentiating) antenna 12.

Figure 4:
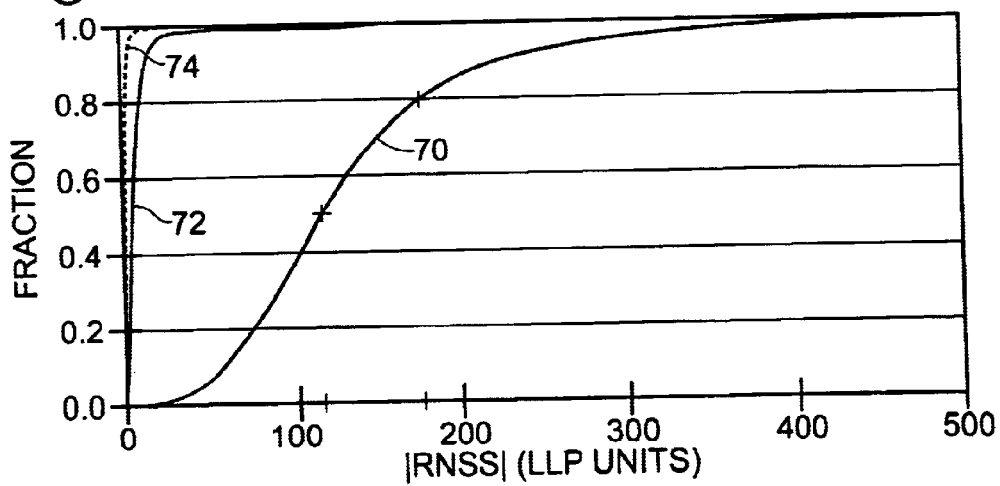
FIG. 4 shows empirically derived cumulative distributions of range-normalized signal amplitude distributions of cloud-to-ground and IC discharges.

FIG. 4 shows empirically determined cumulative distributions of range-normalized signal amplitudes of IC and CG discharges. Range-normalization results in signal amplitude values that are independent of the actual distance between the sensor and the discharge. A first curve 70 in FIG. 4 is a range-normalized representation of CG events. The domain is signal strength in LLP units range normalized to 100 km from the sensor location. Referring to the first curve 70, 50 percent of CG lightning events have an amplitude larger than 120 LLPUs and 50 percent are below 120 LLPUs. Approximately 80 percent of CG events have amplitudes less than 180 LLPUs and 20 percent are greater than 180 LLPUs. A second curve 72 represents the range-normalized distribution of the large and prominent discharges within IC flashes, while a third curve 74 illustrates the range-normalized distribution of all IC discharges. Approximately 70 percent of all IC events are less than 1 LLP. This amplitude disparity requires a novel approach to lightning detection and processing if both CG and IC events are to be detected by the same sensor in the LF/VLF frequency range.

Turning to FIG. 5, a block diagram illustrates the functional aspects of a lightning detection and data acquisition system according to the present invention. A differentiating antenna 92 is used to detect either an electric field or a magnetic field generated by a lightning discharge. The antenna 92 outputs an analog signal representative of the detected field wave ("electrical detection signal") and sends it to the remote programmable sensor 94. The first stage of the remote sensor 94 is a signal conditioning circuit 96 used to reduce the amplitude disparity into between CG representative signals and IC representative signals, reduce noise, and convert the conditioned electrical detection signal to a digital representation. Once the representative signal has been conditioned, it is passed to the event classification stage 98 where the digital representative signal is evaluated to determine what type of event caused the electromagnetic field (either a CG or IC discharge). The remote sensor can be programmed based on user-selectable criteria resulting in only signals of interest being accumulated. The accumulated signals of interest are processed by data compression software 100. If necessary, they are also processed by the data decimation stage 102 and then transmitted to the central analyzer 104 using any digital data transmission means. The central analyzer utilizes data decompression 105 and data correlation 106 followed by location determination 108 to determine the magnitude, location, and time of occurrence of the lightning event.

Figure 6:
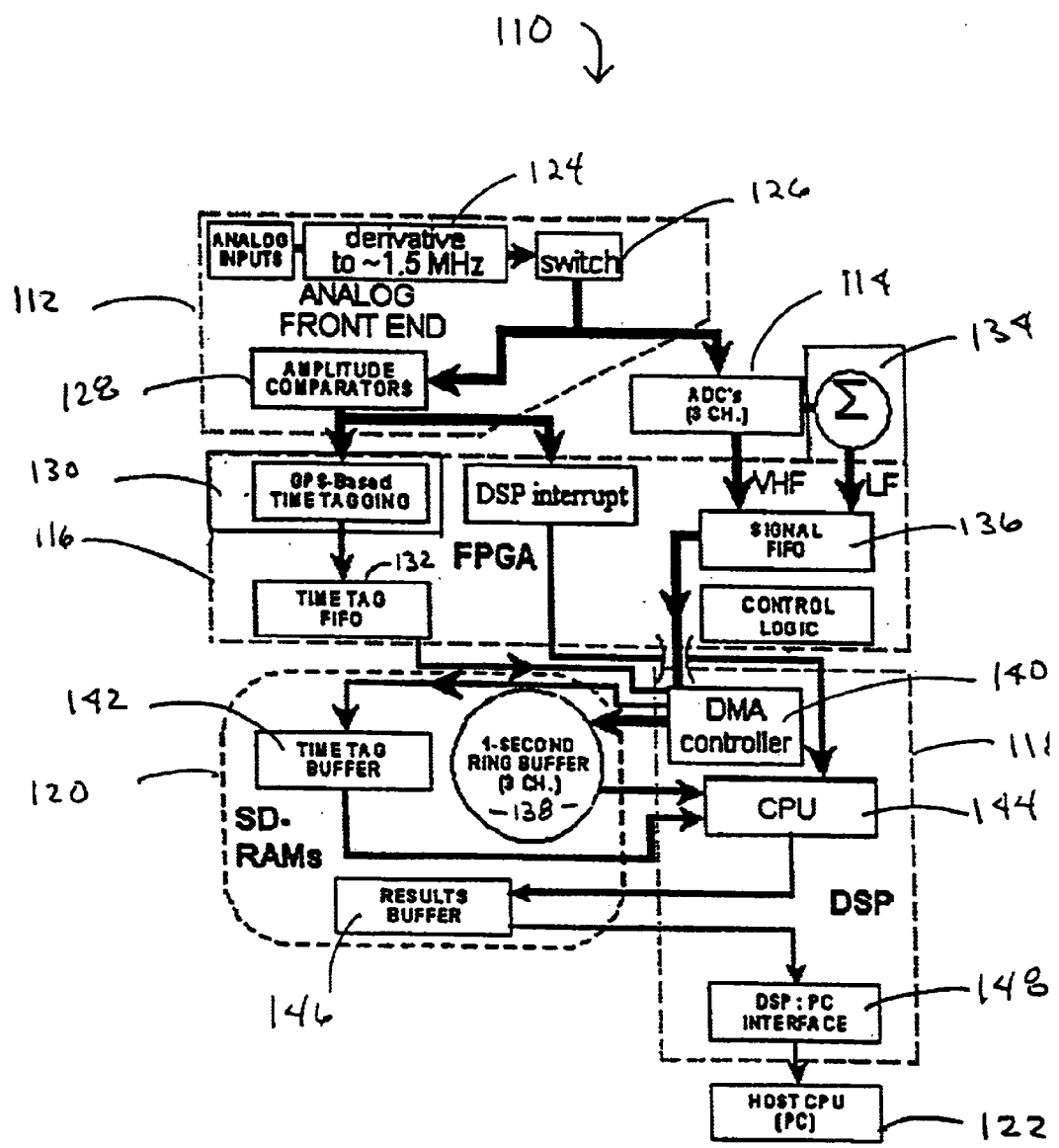
FIG. 6 is a structural block diagram of a preferred embodiment of a lightning detection and data acquisition system according to the present invention.

Referring to FIG. 6, a structural block diagram of a preferred embodiment of a remote programmable sensor 110 is illustrated. The analog front end 112 accepts an analog representative signal from an electromagnetic antenna, filters the representative signal using the filter and amplification component 124 and passes the representative signal to an ADC 114 and an amplitude comparator 128 using a cross-point switch 126. The comparator 128 is used to determine whether the amplitude of the analog representative signal exceeds a previously determined value, indicating the beginning of a "pulse". Upon determination that a pulse has begun, a Global Positioning System ("GPS") device 130 is used to provide a time-stamp which is stored in a time tag first-in-first-out ("FIFO") 132 in a Field Programmable Gate Array ("FPGA") 116. The ADC 114 is used to provide continuous digitization of the signal provided by the cross-point switch 126. The ADC produces a digital signal with 12 bit resolution sampled at 20 MHz. The digitized signal is sent to a digital summer 134 inside the FPGA 116 mentioned above. The summer 134 is used to add groups of four digital samples producing a 5 MHz sample with a 14 bit resolution. These 14 bit digital samples are placed in a signal FIFO 136 in the FPGA 116. A clock signal provided by the FPGA is used to control the flow of digital samples from the signal FIFO 136 to a ring buffer 138 residing in a synchronous dynamic random access memory device ("SD-RAM") 120. Access to the ring buffer 138 occurs by way of a dynamic memory access controller ("DMA") 140, part of a digital signal processor ("DSP") 118. The DMA controller 140 also transfers event time-stamps from the time tag FIFO 132 in the FPGA 116 to a time tag buffer 142 in the SD-RAM 120. A central processor unit ("CPU") 144 inherent in the DSP 118 is used to evaluate data stored in the ring buffer 138 and time-stamp information stored in the time tag buffer 142. Data representing signals of interest are placed in a results buffer 146 in the SD-RAM 120. The information then passes through a DSP-to-PC interface 148 to a host personal computer 122 where it is packaged for transmission.

Figure 8:
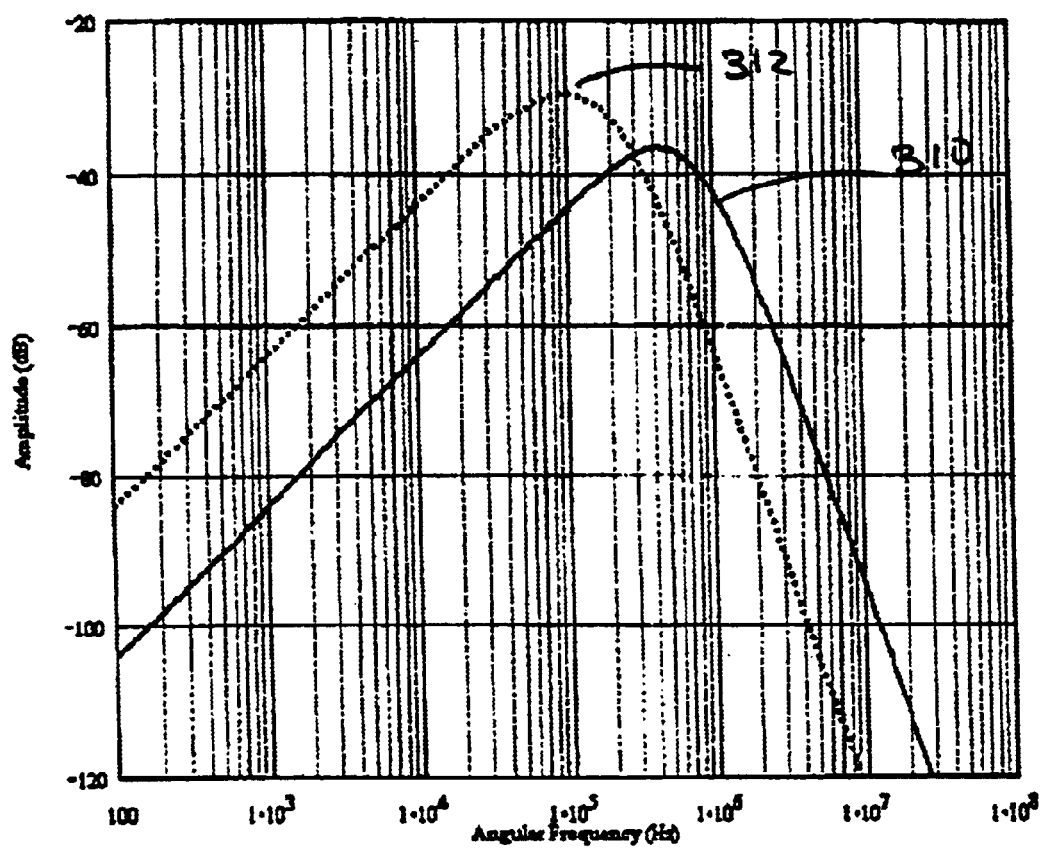
FIG. 8 is a graph of two exemplary frequency responses of the antenna filter network of FIG. 7.
Figure 9:
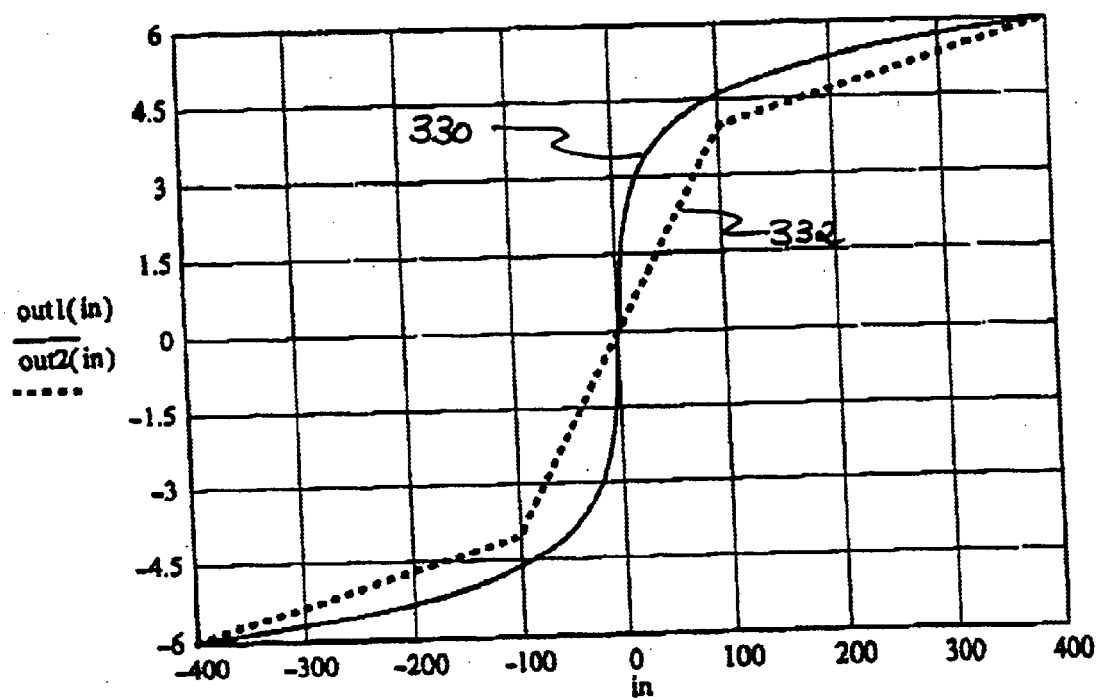
FIG. 9 is a graph of the gains of two non-linear amplifiers.

The signal conditioning and classification aspects of the remote programmable sensor 110 are addressed hereafter, and is illustrated by FIGS. 7, 8, 9, and the flow chart in FIGS. 10A–10H.

Analog Processing

The basic components of the antenna filter network 300 are shown in FIG. 7. An antenna 301 provides a differentiated signal to a low pass filter 302 (four-pole or more) and high-pass filter 304. The filters are followed by an optional non-linear amplification stage 306. Both electric field and magnetic field antennae produce signals that depend on the time derivatives of the field signals they monitor. Thus, this antenna 301 is referred to as a differentiating antenna. This differentiating property of the antenna 301 is important, as it has been discovered that differentiating electromagnetic signals reduces the amplitude disparity between CG and IC representative signals by a factor of two to four. Previous generation lightning detection systems have not made use of this antenna property. In fact, most lightning detection systems integrate the antenna output to get a true representation of the electromagnetic field.

The four-pole low pass filter 302 is used to provide a good transient response to the differentiated signal. The output of the low pass filter 302 is sent to a high pass filter 304 with a cut-off frequency around 300 hertz. The purpose of this filter is to remove any signals that are probably man-made such as 50/60 hertz power-line noise. In the frequency range between these two filters, no filtering is applied. This preserves the differentiated nature of the signal throughout the band where the signals of interest exist. This tuning of the filters effectively creates an analog leaky integrator that is tubule to allow frequencies below 0.5–1 MHz to pass through without being integrated. An optional component of the invention is the use of non-linear amplifiers 306 to further reduce the amplitude disparity between CG and IC representative signals. A first curve 310 of FIG. 8 shows the frequency response of the leaky filter network, including the differentiating antenna, in the preferred embodiment. A second curve 312 illustrates the frequency response of the leaky filter network wherein the time constant has been adjusted to remove excessive man-made radio frequency noise.

The non-linear amplifier 306 of the preferred embodiment amplifies low amplitude signals disproportionately more than high amplitude signals. Two types of non-linear amplifiers that are well suited to this application are the logarithmic amplifier and the piece-wise linear amplifier. Both of these types of amplifiers can reduce the amplitude disparity between CG and IC signals by 12–24 dB. FIG. 9 illustrates the input-output characteristics of these non-linear amplifiers. A first curve 330 shows the response of a logarithmic amplifier while a second curve 332 illustrates the response of a piece-wise linear amplifier.

Figure 10A:
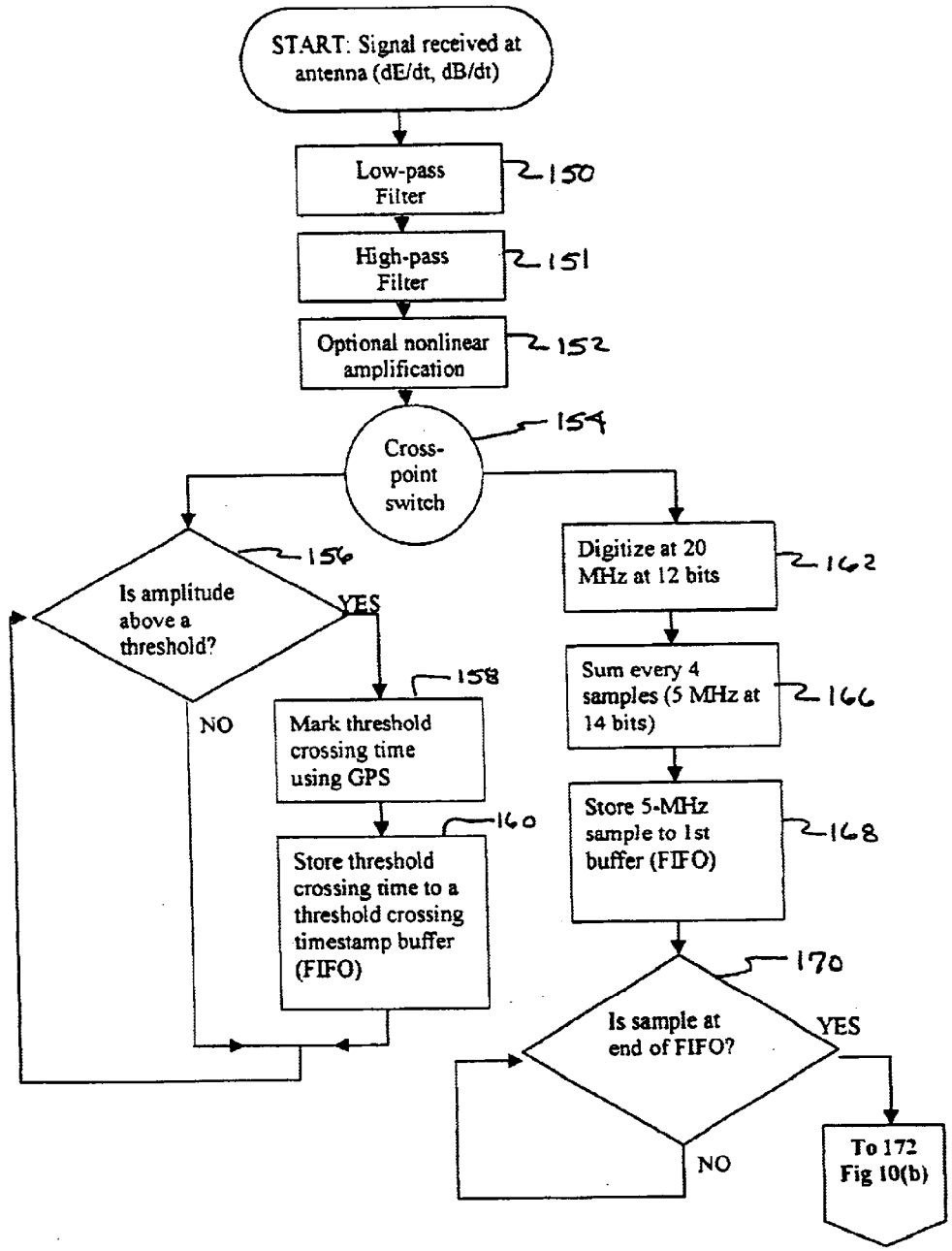
FIG. 10A–10H is a flow chart of the operation of a preferred embodiment of a detection and data acquisition method for individual lightning discharge pulses according to the present invention.

Referring to FIG. 10A, a differentiated representative analog signal is received from the antenna 92 of FIG. 5. Steps 150 and 151 are low-pass filtering necessary to remove high frequency noise from the representative signal, followed by high-pass filtering used to remove power line noise. Optional non-linear amplification 152 is used to amplify low-amplitude signals disproportionately more than high amplitude signals, reducing the amplitude disparity between CG and IC signals.

Data Gathering

Following non-linear amplification 152 in FIG. 10A, using the cross-point switch 154, analog information is sent to threshold comparison 156 and digitization 162. If a representative signal exceeds a pre-determined amplitude value, a "threshold crossing time" is established in step 158 using the GPS device 130 of FIG. 6 and placed into the time tag FIFO 132 per step 160. Simultaneous with threshold comparison 156, 12 bit resolution continuous digitization 162 at a rate of 20 MHz occurs at the ADC 114 of FIG. 6. In LF/VLF sensors, every four samples are added together in step 166 using the digital summer 134 of the FPGA 116. The result, a 5 MHz data sample stream with 14 bits of resolution, is stored per step 168 in the signal FIFO 136 of the FPGA 116. The process of moving samples through the FIFO 136 until they reach the end is shown by step 170. Control logic provided by the FPGA 116 and the DMA controller 140 are used to control the flow of digital samples from the signal FIFO 136 to the ring buffer of the SD-RAM 120; this is shown by step 172 of FIG. 10B. Implicit in the address of the data sample within the ring buffer is the time stamp to the fraction of a second. A separate clock signal in the DSP 118 is used to regulate reading data samples from the ring buffer 138 into the CPU 144 of the DSP per steps 174. In practice, the transfer of data into the ring buffer at step 172 is always a few samples ahead (in time) of the transfer of data out of the ring buffer and into the DSP CPU at step 174. This time lag is represented graphically by the "future buffer" 173 in FIG. 10B to symbolize the fact that this lag allows the DSP to examine a few samples on either side of the sample currently being examined at step 176. Step 178 provides the next time-stamp from the time tag buffer 142 to the CPU 144. Step 176 is the determination of whether the current data sample occurred at or after the threshold crossing time indicated by the time-stamp. If so, step 180 is used to determine whether the amplitude of the digitized signal has been below a threshold established for the end of an event. If so, the event which produced the pulse beginning with the time-stamp retrieved by step 178 is deemed to have ended, i.e., the pulse is over. Step 182 is used to advance the time tag buffer to the next event of interest and proceed to pulse classification, step 184. If the result of step 180 is that the pulse is not deemed complete and we are just beginning a pulse, then steps 186 and 188 are used to find the time of the first data sample within the present pulse that had an absolute magnitude above the noise level. This time is not the same as the time-stamp retrieved in step 178, as the time-stamp was recorded only after the current pulse exceeded a pre-determined threshold magnitude (set higher than the noise floor).

Figure 11:
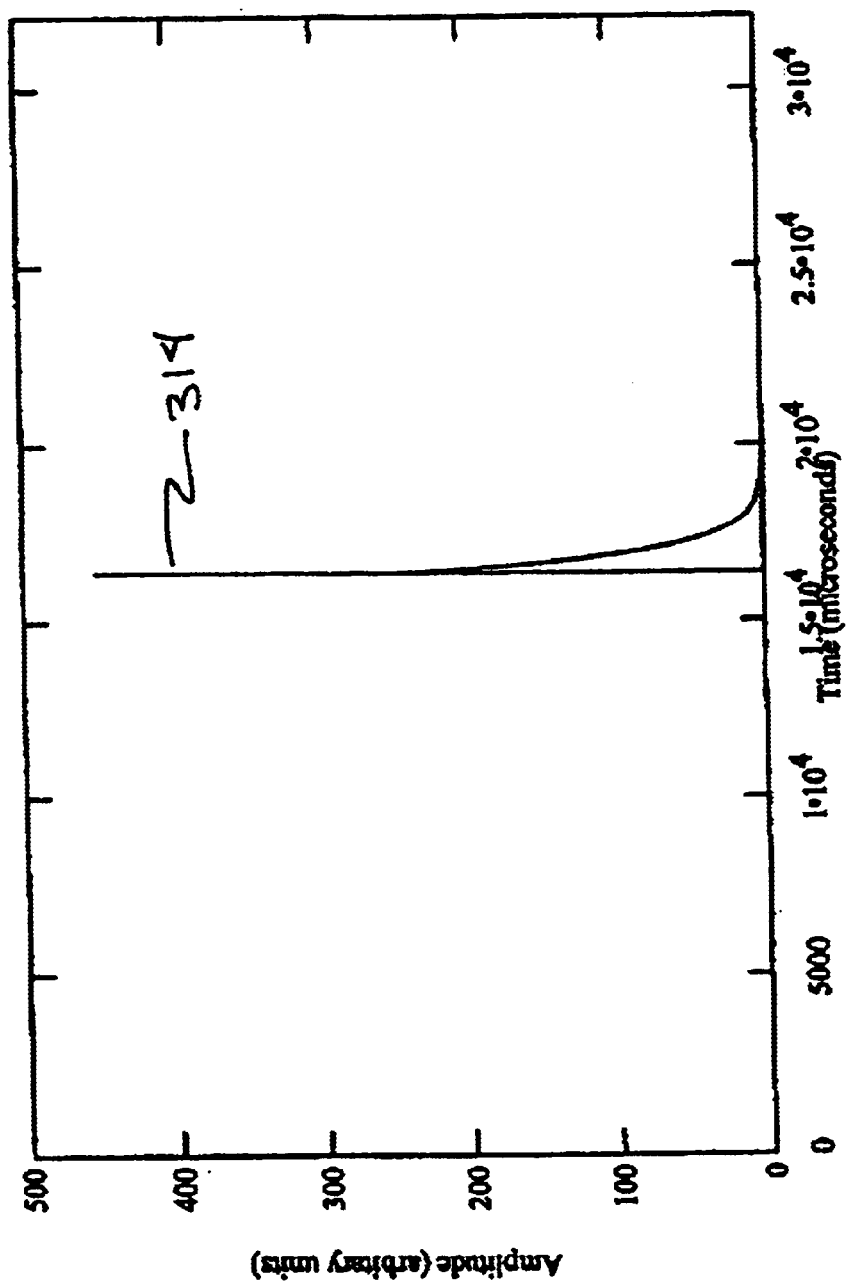
FIG. 11 shows the time domain response of a digital filter according to the present invention for numerical integration of signals representative of the time derivative of the field.
Figure 12:
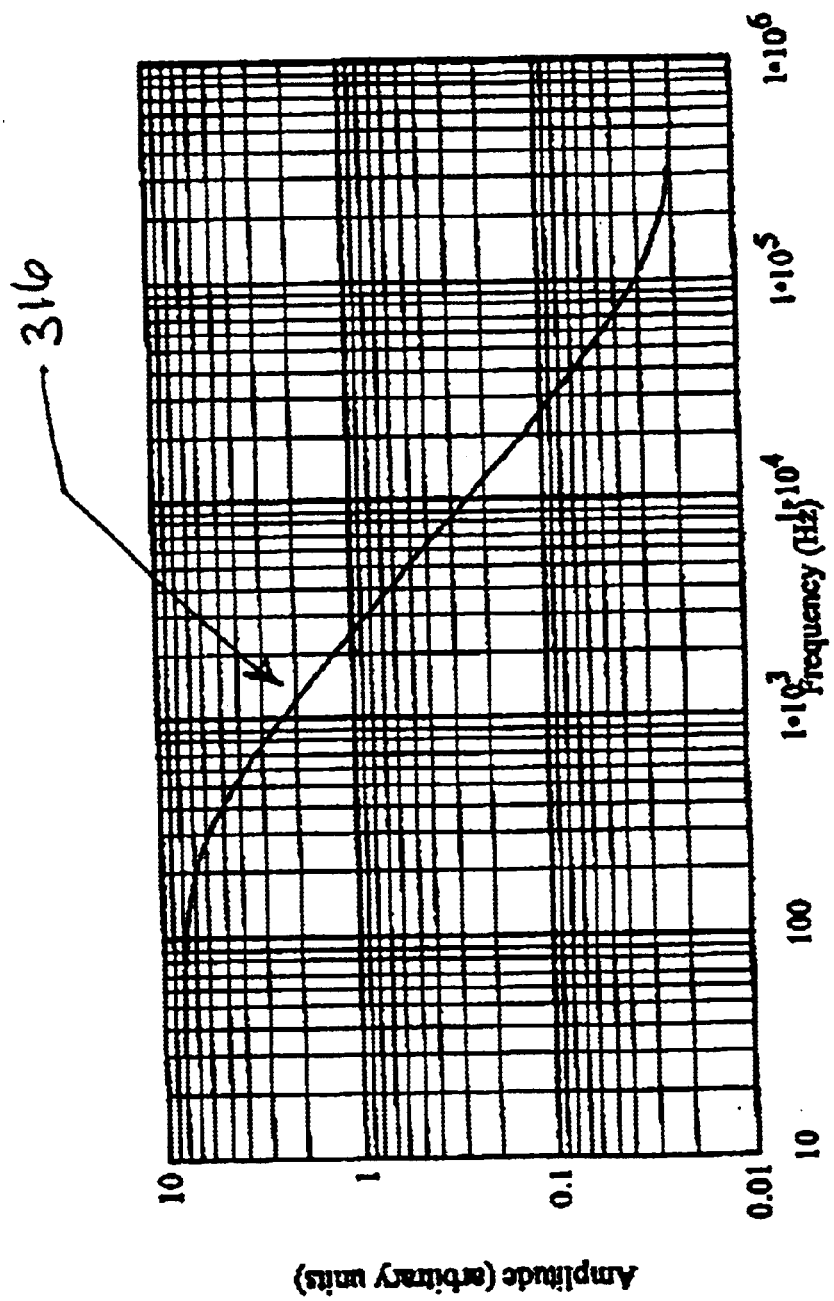
FIG. 12 shows the frequency domain response of a digital filter according to the present invention for numerical integration of signals representative of the time derivative of the field.
Figure 13:
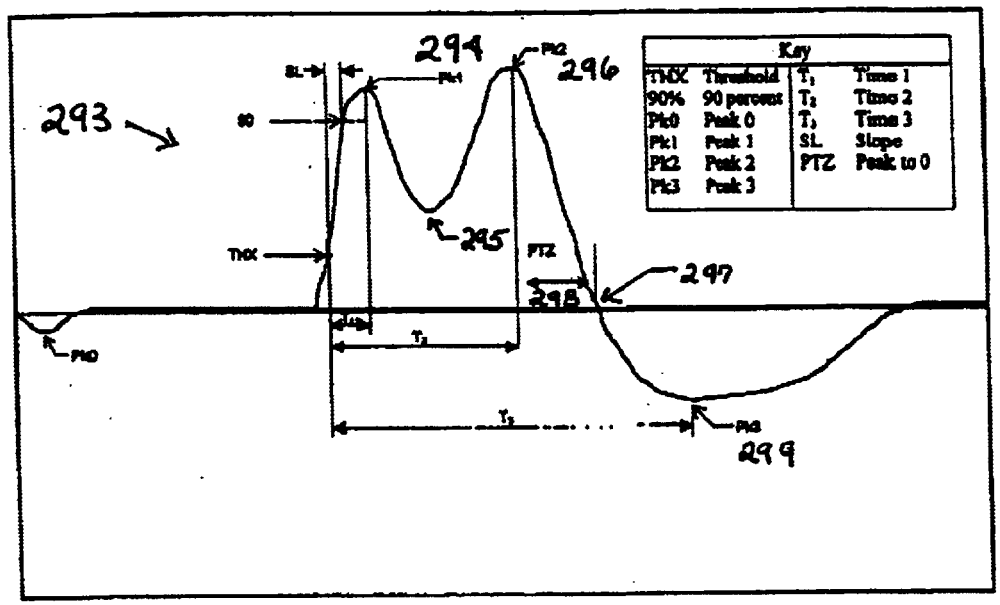
FIG. 13 illustrates the analysis performed on a general field waveform by a system according to the present invention.

Steps 189 and 190 are used to generate a representative field signal by numerically adding the current data value to a weighted sum of all previous data values where the weighting is a function of the age of the samples. This process constitutes a digital integrator to reconstruct the field signal over the band of interest using the differentiated field signal that has been passed through to this point. FIG. 11 shows the time domain response 314 of the digital integrator according to the present invention. FIG. 12 shows the frequency domain response 316 of the digital integrator according to the present invention. At the completion of step 192 of FIG. 10C, the data sample now has three components: a time-stamp, the value of the derivative field signal, and the value of the representative field signal itself. A signal representative of an entire field pulse 293 after the digital integration is illustrated in FIG. 13.

Peak and Trough and Zero-crossing Determination

Steps 194 and 196 are used to look for peaks and troughs in the representative field signal by searching the derivative signal for zero crossing points. In practice, the differentiated signal will contain some noise and will need to be smoothed 193 (digitally filtered) in order to retain prominent peaks and troughs without flagging all small high-frequency sign changes in the time derivative as significant peaks and troughs in the field signal. In a preferred embodiment, this smoothing will involve several samples on either side of the current sample. A first peak 294, a first trough 295, a second peak 296, and a zero crossing point 297 of the representative field signal 293 are shown in FIG. 13. The number of peaks in the current pulse is recorded in step 200. In accordance with step 202, if the field representative signal has changed polarity, then a zero-crossing time is recorded in step 204 and a counter is incremented in step 206 of FIG. 10D. Once the data sample has been tested for peaks, troughs, and zero-crossing times, the next data sample is read into the DSP's CPU 144 in step 208 of FIG. 10D and the process returns to step 174 of FIG. 10B.

The process steps illustrated by FIGS. 10A, 10B, 10C, and 10D are used to detect signals of interest and gather information. Specifically, at the conclusion of step 208, the following information has been determined: (1) the number of peaks in the current pulse of the field representative signal; (2) the number of troughs in the current pulse; (3) the time and amplitude of each peak and trough of the current pulse; (4) the number and times of zero crossings in the current pulse.

Pulse Classification

Figure 10B:
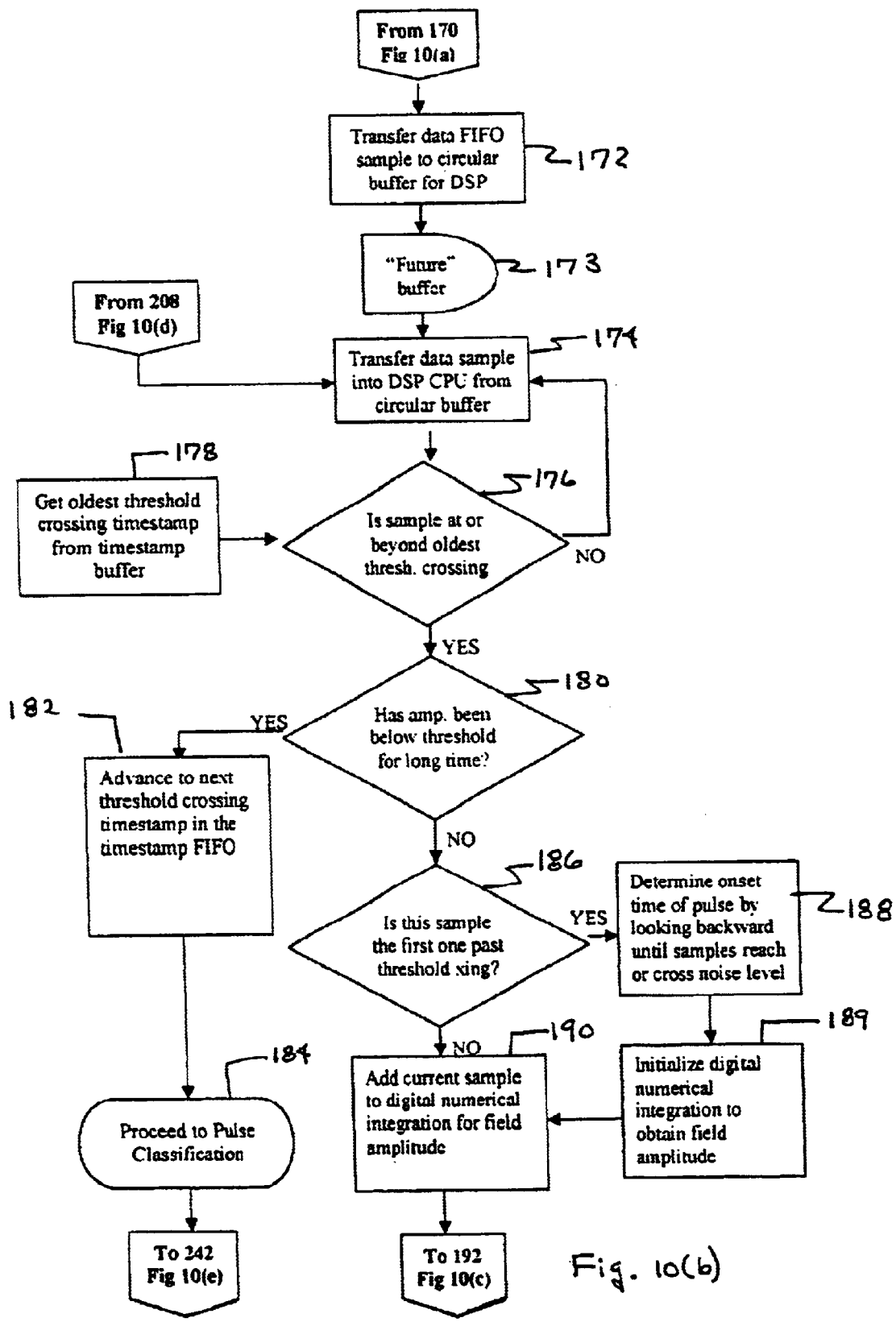
Figure 10C:
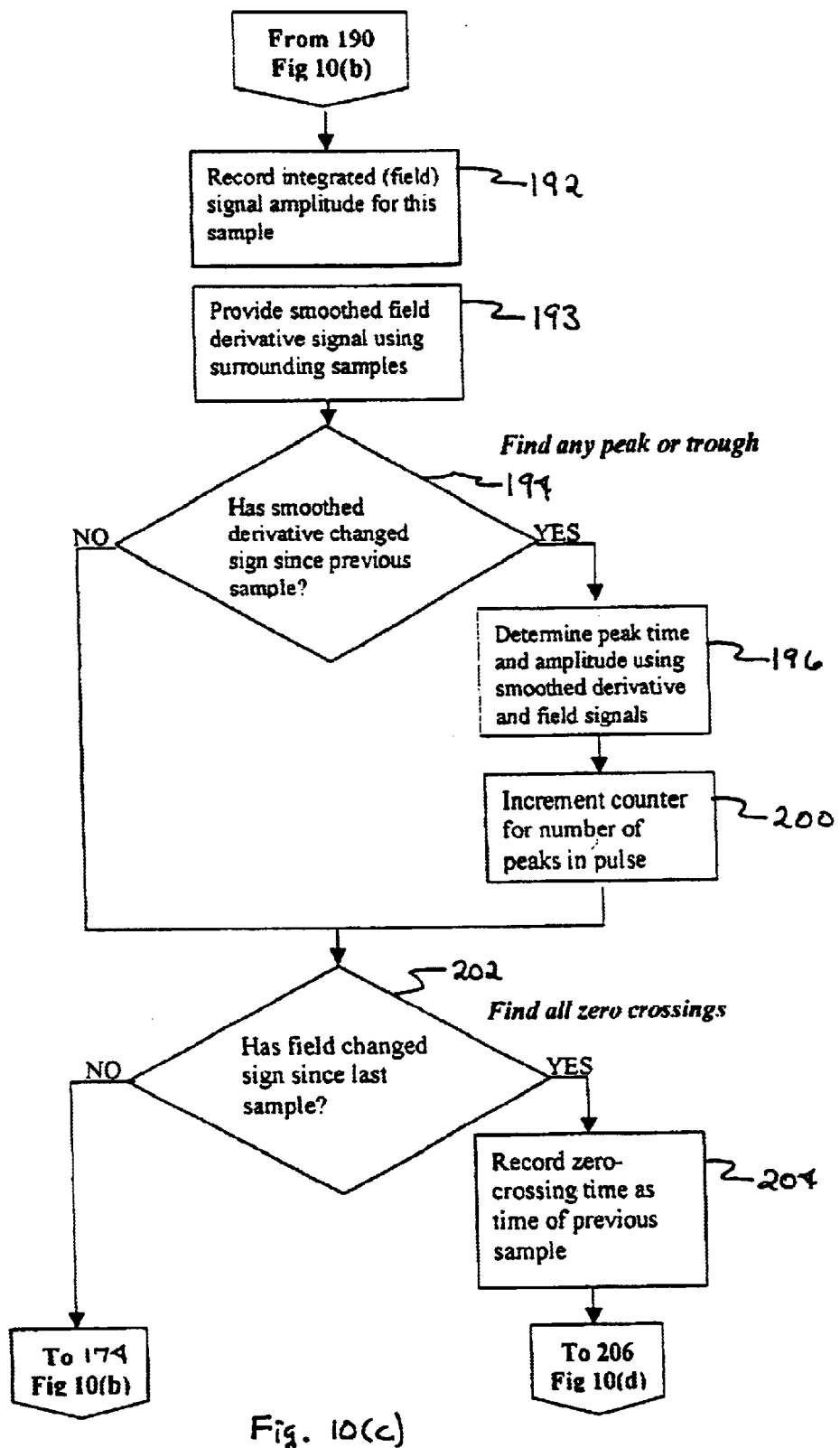
Figure 10D:
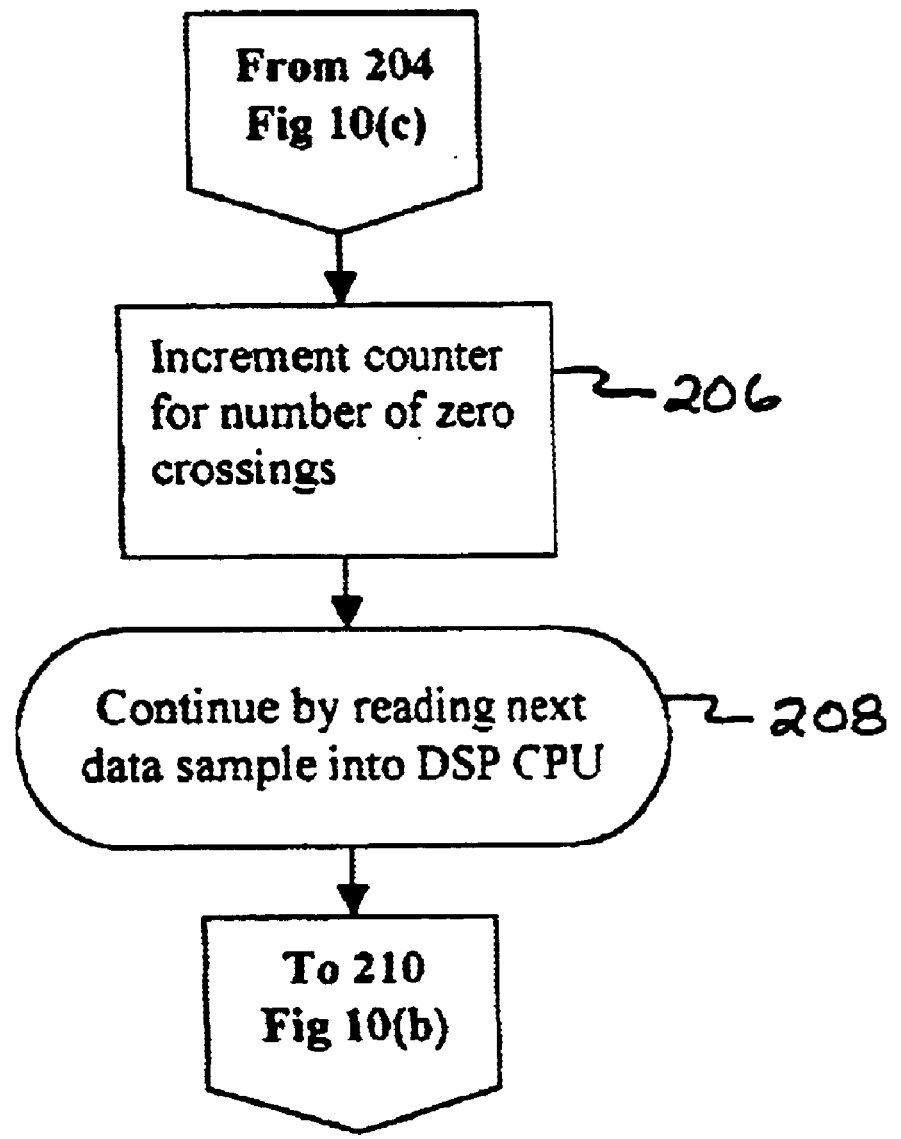
Figure 10E:
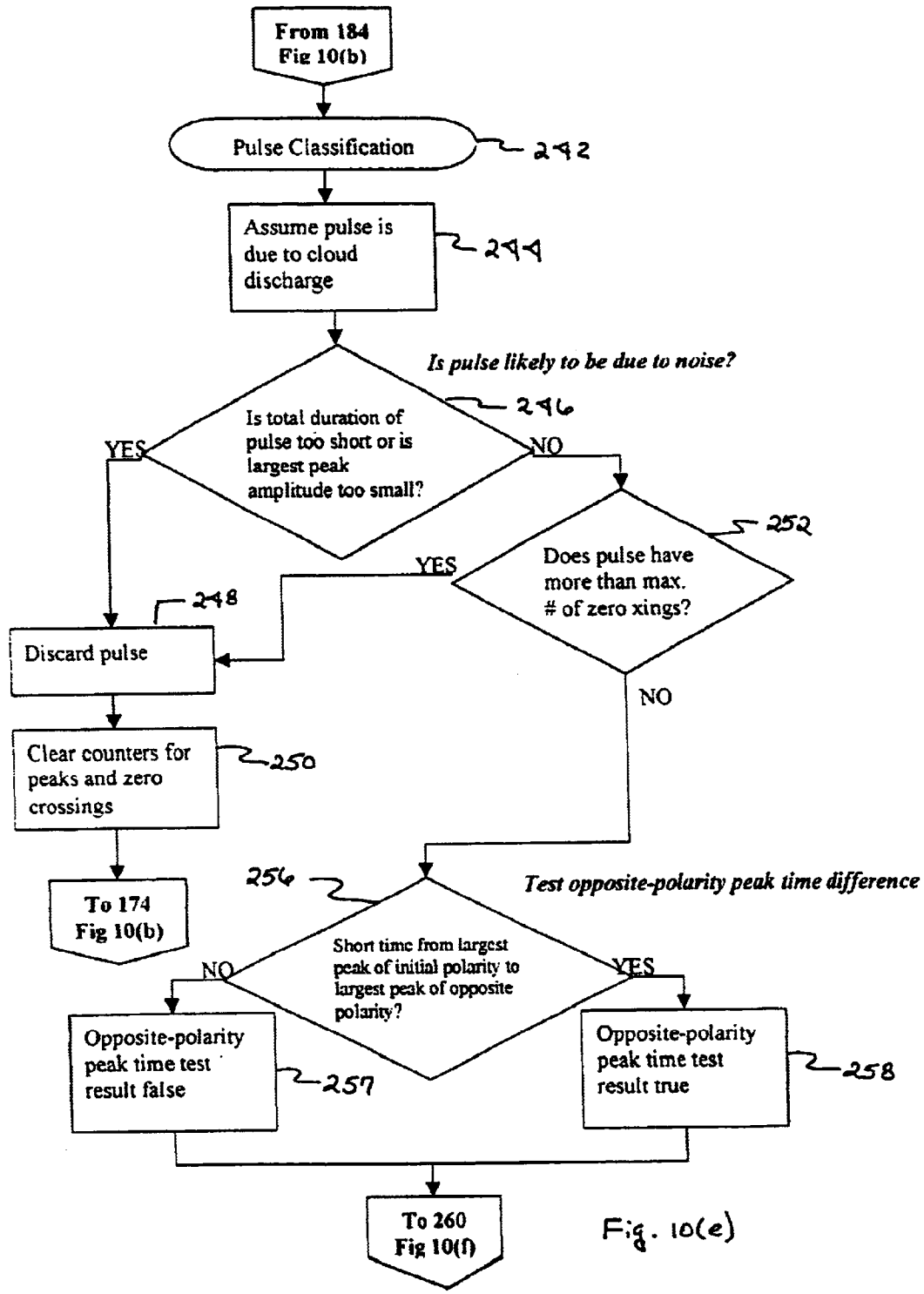

Once the pulse is determined to have terminated at step 180 of FIG. 10B, then the process proceeds from step 184 to step 242 of FIG. 10E where pulse classification begins. Pulse classification begins by establishing a default value for the pulse as a IC event in step 244. The overall pulse duration is evaluated in step 246. If the pulse is too short in duration or the largest amplitude of any peak within the pulse is too small, the event is presumed to be noise and is discarded in step 248, the counts of zero crossings, peaks, and troughs are zeroed at step 250, and the process returns to step 174 of FIG. 10B. If the pulse has sufficient duration, then it is evaluated for an excessive number of zero crossings in step 252. Too many zero crossings are another indication of noise, in which case the pulse is discarded in step 248 and the process returns to step 174 of FIG. 10B. A novel pulse classification process is illustrated by step 256, where the pulse is evaluated for a short time from the largest peak of the first polarity to the largest peak of opposite polarity. The result of this test must be temporarily saved (steps 257 and 258) because after this test, all pulses proceed to the bipolar amplitude ratio test at step 260 of FIG. 10F. This pulse classification parameter is given by the time between the first peak 294 and the second peak 296. Pulses with a short time differential between these peaks are classified as IC pulses or leader pulses.

Bi-polar Amplitude Ratio Test

Step 260 is used to determine if the largest of any subsequent opposite polarity peaks (299 of FIG. 13) is greater than a pre-determined fraction of the largest peak of the initial polarity 294. In the event that the opposite polarity peak time difference (step 256 of FIG. 10E) was short, the bipolar amplitude ratio distinguishes between bipolar IC discharge pulses and leader pulses, which tend to be nearly unipolar. Thus, after step 260, the result of the opposite-polarity peak time test must be examined (steps 261, 263). If the bipolar amplitude ratio 260 was large and the opposite polarity peak time result was true (step 263), the pulse is classified as a bipolar IC pulse (step 265). If the bipolar amplitude ratio is small and the opposite polarity peak time result was true (step 261), the pulse is classified as due to a leader (step 264). In the preferred embodiment, leader pulses are considered a special case of IC discharge pulses. Beyond steps 264 and 265, no further testing is required, and the IC discharge pulse information is saved 267 at step 284 of FIG. 10H. On the other hand, if the bipolar amplitude ratio is large, and the opposite-polarity peak time result was false (step 263), the pulse is classified as due to a distant CG stroke in step 270. Finally, if the bipolar amplitude ratio is small and the opposite polarity peak time result was false (step 261), the pulse is classified as due to a CG return stroke (not distant) at step 268. In either event, pulse classification continues at step 271. Optionally, if classification is used to eliminate IC discharges, the pulse may be discarded in step 266 and the process returns to step 174 of FIG. 10B.

Peak-to-zero Test

Figure 10F:
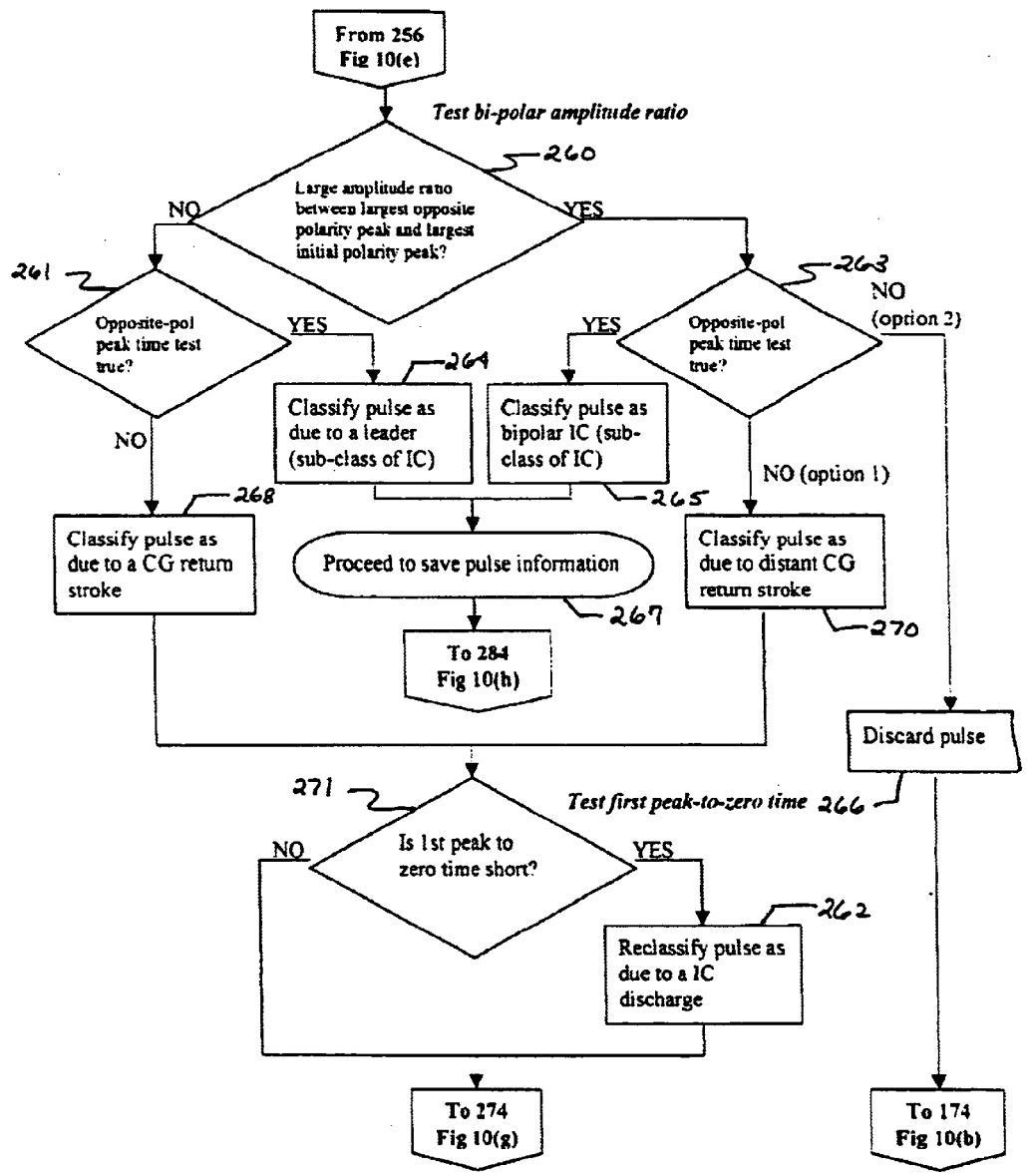

The first peak to zero time is evaluated at step 271 of FIG. 10F. If the peak-to-zero time 298 of FIG. 13 is relatively long in duration, the pulse retains its classification as a CG event. If the peak-to-zero time 298 is short, then the pulse is reclassified as a IC event in step 262. In either event, pulse classification continues at step 274 of FIG. 10G.

Second Peak Greater than First Peak Test

Figure 10G:
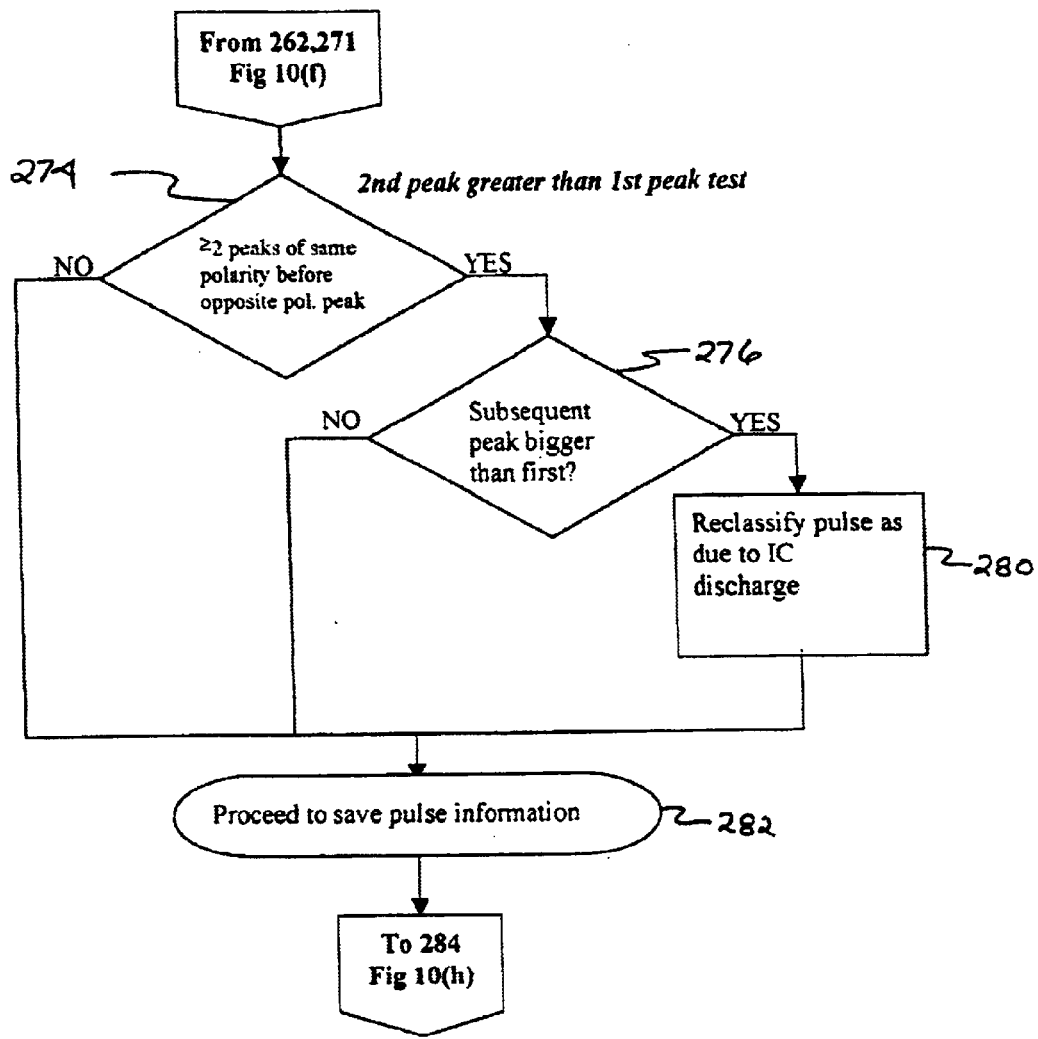

Step 274 of FIG. 10G determines whether more than one peak of the same polarity (294, 296 of FIG. 13) occurs prior to an opposite polarity peak 299. If not, pulse classification ends at step 282. Otherwise an additional test 276 is used to determine whether a second peak of the same polarity 296 within the pulse is sufficiently greater in amplitude than the first peak 294 of the pulse. If true, the pulse is reclassified as a cloud discharge in step 280. Otherwise, the pulse retains its classification as a CG discharge. In either case, classification ends at step 282 and the process proceeds to recording pulse information, step 284 of FIG. 10H.

Save Pulse Information

Figure 10H:
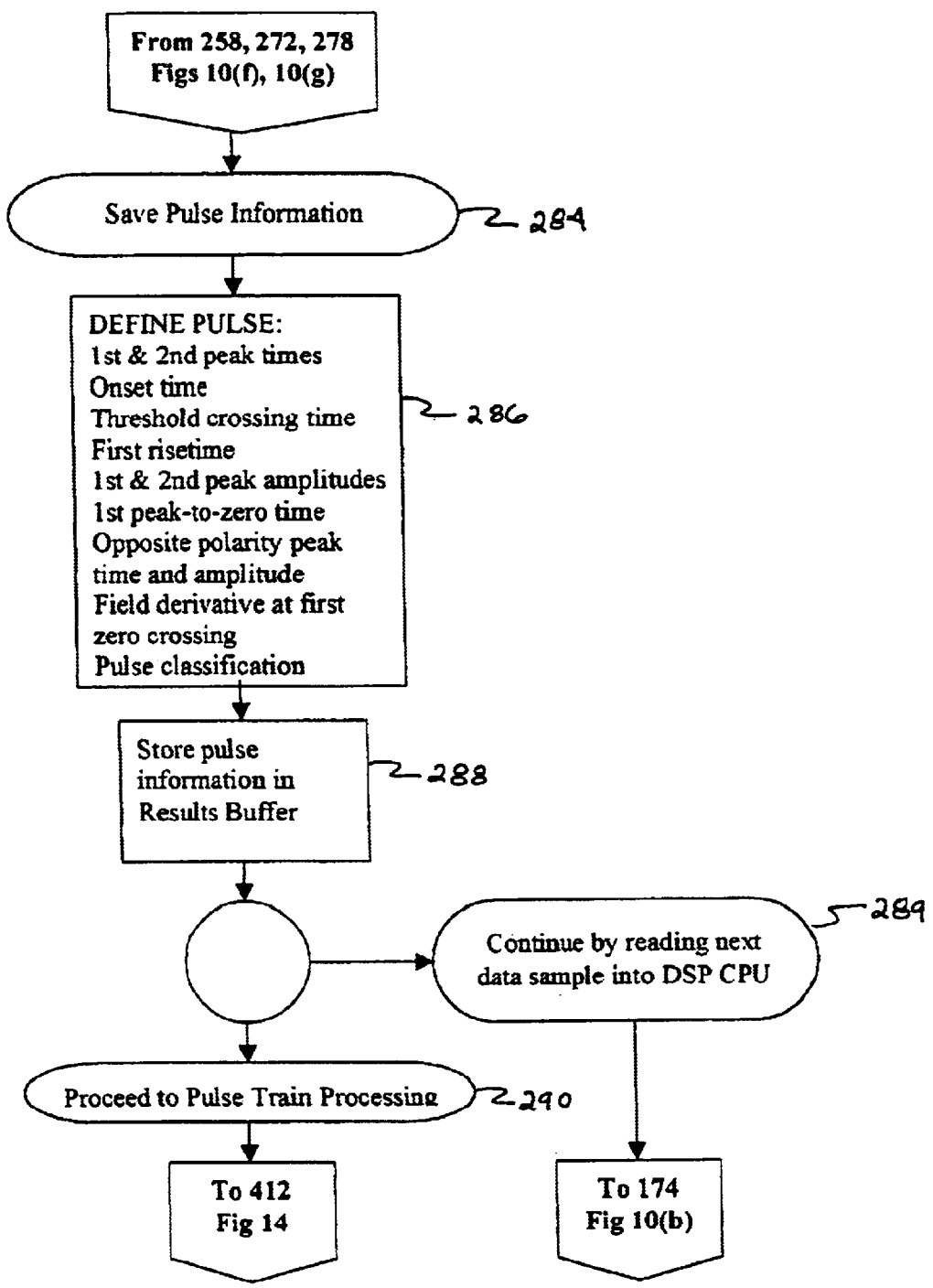

Step 284 of FIG. 10H begins the process of storing pulse information and event classification. In step 286, the pulse is defined by the following information: the threshold crossing time, the onset time; the first and second peak times; the first rise time; the first and second peak amplitude; the peak-to-zero time; opposite polarity peak time and amplitude; field derivative at first zero crossing; pulse classification. In step 288, this information is stored in the results buffer 146 of the SD-RAM in FIG. 6. At this point, the process obtains a new data sample (step 289) and returns to step 174 of FIG. 10B. At the same time, the pulse information saved to the results buffer at 288 is made available to another process 290 that looks for and processes pulse trains.

Pulse Train Processing

Figure 14:
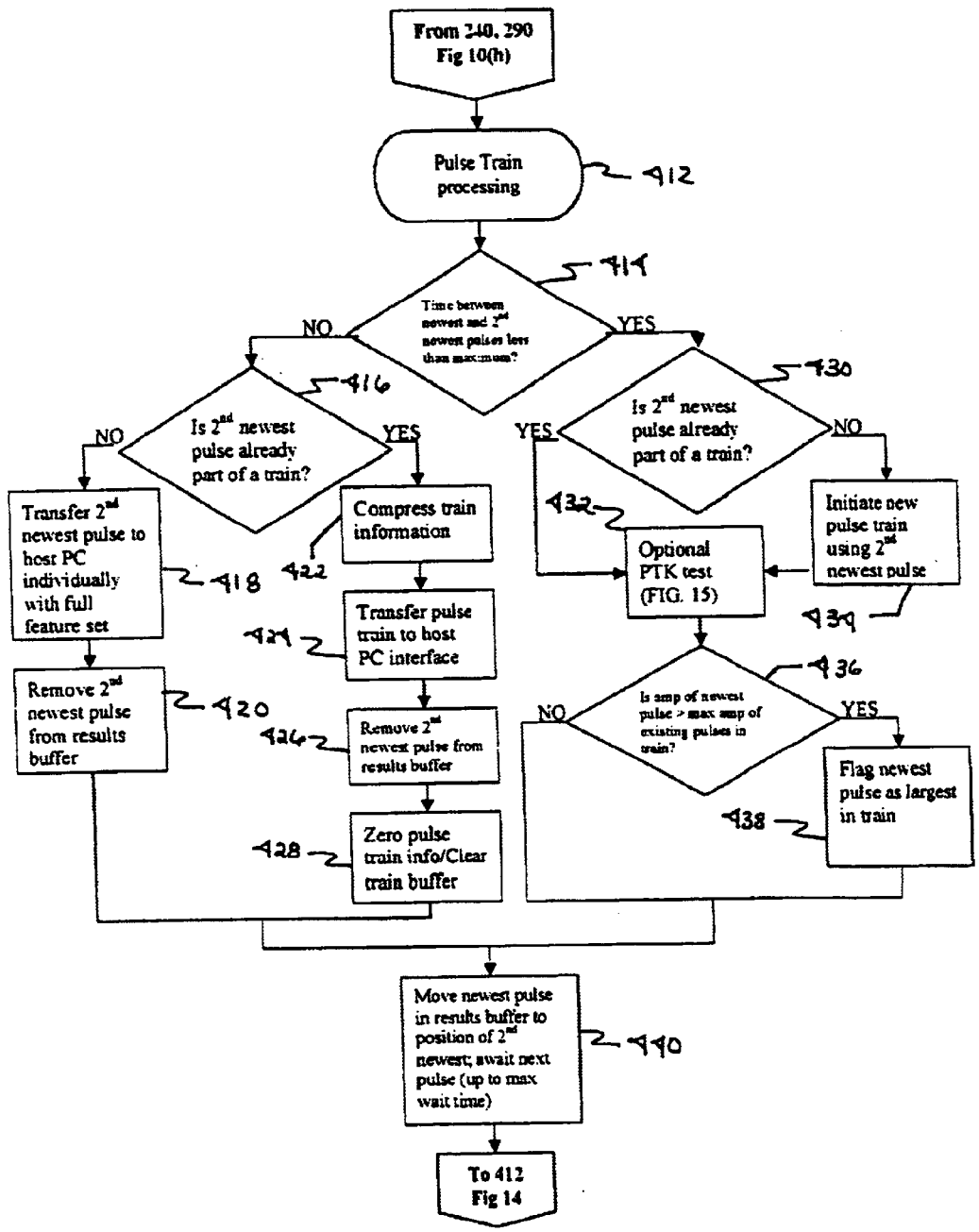
FIG. 14 is a flow chart illustrating the process of grouping individual pulses into pulse trains according to the invention.

The flow chart of FIG. 14 illustrates the process of grouping individual pulses into pulse trains. Pulse train processing begins at step 412 and is initiated when pulse information has been stored in the results buffer 146 in step 288 of FIG. 10H. The time between the most recent pulse and the previous pulse is evaluated in step 414. If the time interval between the two pulses exceeds a pre-determined amount, then the previous pulse is examined, step 416, to determine if it is part of an existing pulse train. If so, the existing pulse train is deemed to have ended, the data are compressed in step 422, the compressed data is sent to a host PC 122 in step 424, the previous pulse and its associated pulse train are removed from the results buffer 146 in step 426, and the pulse train buffer is cleared in step 428. If the previous pulse is not part of an existing pulse train, the previous pulse is transferred to the host PC 122 in step 418 with all of the parameters saved at step 286 of FIG. 10H, and it is then removed from the results buffer 146 in step 420. If the time interval evaluated in step 414 is found to be less than a pre-determined amount, then the previous pulse is evaluated to determine if it belongs to an existing pulse train in step 430. If so, an optional PTK test is performed in step 432 and the amplitude of the newest pulse is evaluated to determine whether it is greater than any previous pulse in the current pulse train in step 436. If found to be larger than any previous pulse in the current pulse train, the newest pulse is flagged in step 438. Returning to step 430, if the previous pulse is not part of a current pulse train, then a new pulse train is created starting with the previous pulse in step 434 and the process proceeds to steps 432, 436 and 438. The final step of this process is to move the newest pulse into the position of the second newest pulse in the results buffer 146 at step 440 and then return to step 412 awaiting the arrival of the next pulse. A maximum wait time is also used to make sure that pulses are transmitted to the central analyzer within a reasonable time period when there is little activity.

Figure 15:
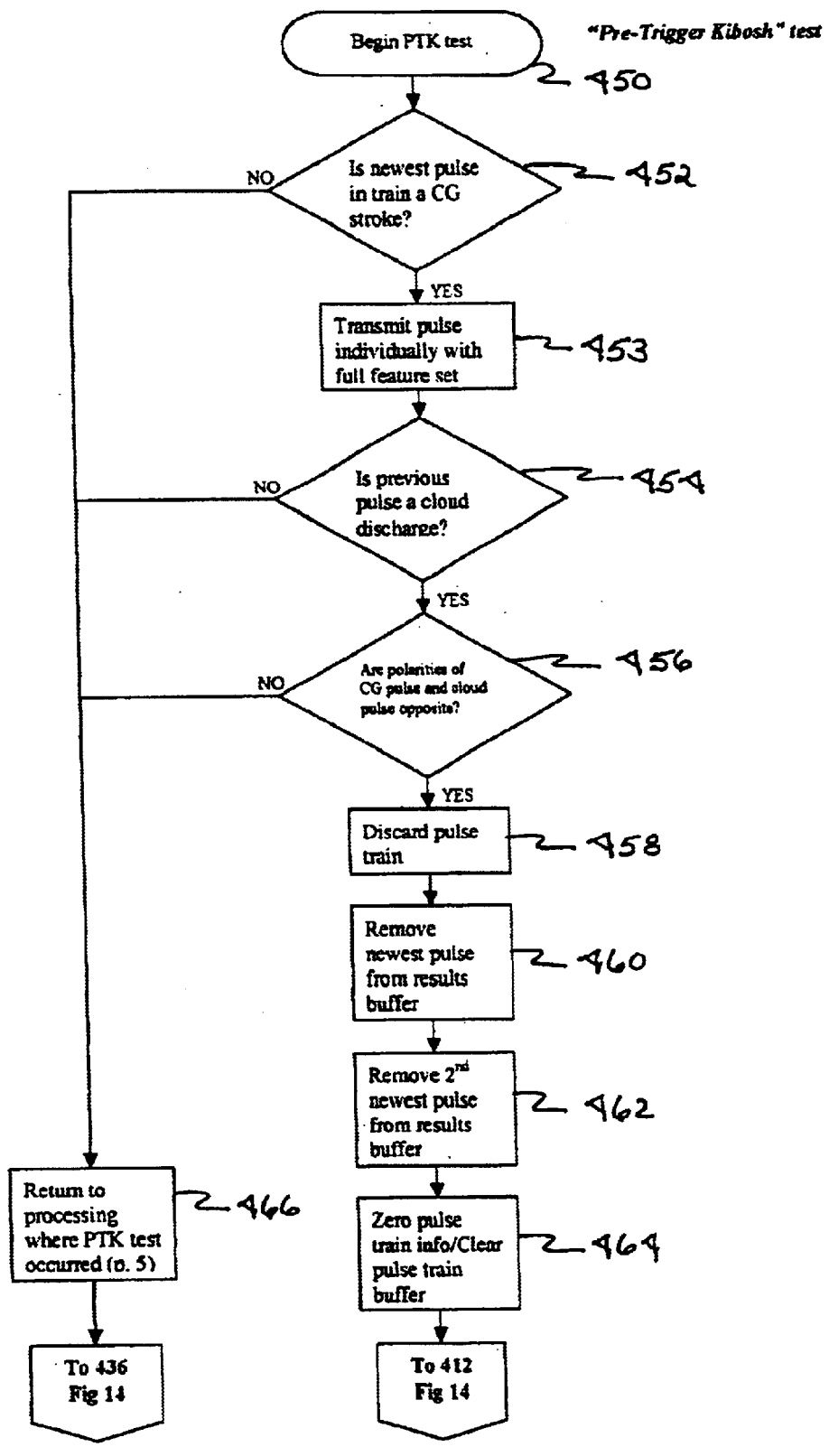
FIG. 15 is a flow chart illustrating a "pre-trigger kibosh" test

In previous generation lightning detection systems, "pre-trigger kibosh" tests consisted of determining whether a CG stroke was immediately preceded by an event of opposite polarity. If so, both the current pulse and previous pulse were discarded as they were deemed to have been most likely caused by an IC discharge or noise or interference. In these earlier systems, it was deemed more efficient to discard these pulses than tie up the analog hardware with further analysis. However, in the present invention it has been found more effective to perform more thorough pre-trigger kibosh tests. Referring to FIG. 15, a flow chart illustrates the pre-trigger kibosh test referred to in FIG. 14. This test begins with step 450. The current pulse is evaluated in step 452 to determine whether it is a CG stroke. If not, the process returns to the pulse train processing algorithm step 466. However, if the current pulse is a CG stroke, then it is first transmitted to the host PC at step 453 with the complete set of features saved at step 286 of FIG. 10H. Then, the previous pulse is examined in step 454 to determine whether it is an IC event. If not, the process returns to the pulse train processing algorithm at step 466. If the current pulse resulted from a CG stroke and the previous pulse was caused by an IC event, then the next step 456 of the algorithm is to determine whether the current pulse and previous pulse have opposite polarity. If not, the process returns to the pulse train processing algorithm at step 466. If both pulses do have opposing polarity, the current pulse train is discarded in steps 458–464 and the process returns to step 412 of FIG. 14.

As mentioned in the Summary of the Invention, RPS sensors are capable of detecting and evaluating at least an order of magnitude more lightning discharges than previous generation sensors. Therefore, an improved method for sending the lightning information to the central analyzer is required. The present invention uses a novel data compression process for lightning discharges that occur in pulse trains according to the process of FIG. 14. The largest pulse is designated as the reference pulse and its amplitude, time, and direction (if available) are included in an 88 bit data record. Other pulses in the pulse train are represented by a fractional amplitude of the reference pulse with a time-stamp relative to the time of either the preceding or the following pulse, represented by 24 bit data records. This greatly reduces the information that must be transmitted.

Referring to FIG. 16, six electromagnetic pulses 470 are listed with their associated fractional second time 472, time in microseconds 474, and amplitude 476. These example pulses occur at midnight on Aug. 6, 2001. The first pulse occurred 500 microseconds after midnight on this date and is represented in detail in FIG. 17. The full time stamp of the largest pulse in this example is 997056000 seconds since Jan. 1, 1970 ("UNIX time"). A 32 bit hexadecimal representation 480 of this time stamp is: 3B6DDE00h. A fractional time count is derived by dividing the 500 microseconds by a predetermined unit of time, which is 50 nanoseconds in the preferred embodiment because of the use of a 20-MHz ADC (each 50 nanosecond period being a "50 nanosecond count"). 500 microseconds divided by 50 nanoseconds produces a fractional time count of 10000. The hexadecimal representation 482 of this fractional time count is 2710h. The hexadecimal representation 484 of the amplitude of the first pulse 471 (4400 counts) is 1130h. This particular sensor does not provide directional information, noted by assigning a value of three hundred and fifty nine point ninety-nine (359.99) degrees as the angle measurement. The hexadecimal representation 486 of this angle measurement is 7FFFh. A determination that this pulse was generated by a IC discharge is indicated with a binary bit of "1" 488 (CG strokes would generate a "0" bit).

Data Compression

Figures 19, 22:
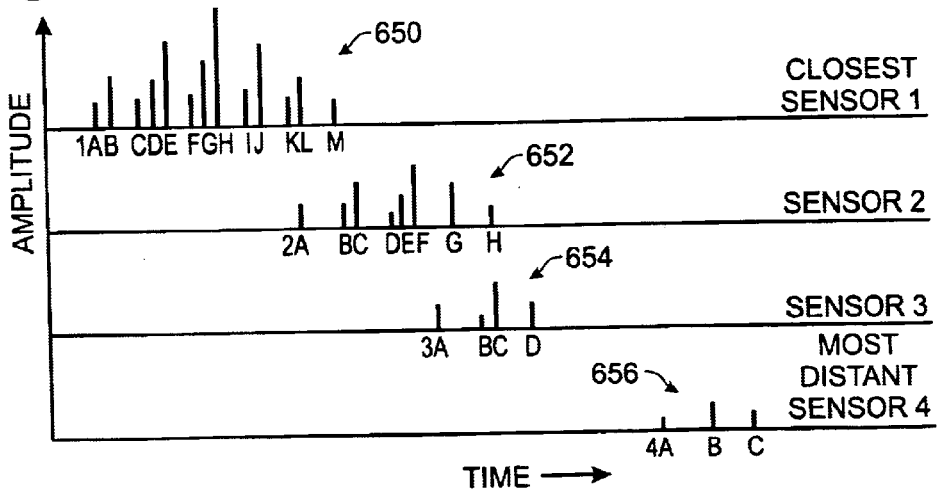
FIG. 19 illustrates binary and hexadecimal representations of all pulses other than the largest pulse of the pulse train of FIG. 16.
FIG. 22 is a time graph depicting the arrival of electromagnetic pulses at different remote programmable sensors as reconstructed through the de-compression process of FIGS. 21A–21C.

The illustrations of FIGS. 18 and 19 and the flow-chart of FIGS. 20A–20D are used to illustrate the process of compressing pulse trains into data records.

During the grouping of pulses (FIG. 14), the largest amplitude pulse is identified. In this example, the second pulse 473 of FIG. 16 is the largest with an amplitude of 5100 counts. A binary representation of the largest amplitude pulse 473 including time, fraction of second count, amplitude, angle, classification, and an additional bit indicating whether fractional amplitudes of the smaller pulses are included is produced according to the invention. FIG. 18 shows the 88-bit compacted representation 490 of the largest pulse for the present example according to the compression algorithm. A hexadecimal representation 492 of the largest amplitude pulse 473 is also shown with the binary representation 490 in FIG. 18.

According to the invention, pulses in the same pulse train other than the largest amplitude pulse 473 are represented by fractional amplitudes relative to the largest pulse 473 and time differences relative to the preceding or following pulses. For each pulse prior to the largest pulse, the time difference is established by subtracting the 50 nanosecond time count of the current pulse from the 50 nanosecond time count of the pulse that follows it, resulting in a 13 bit signed binary number that is negative. Likewise, for each pulse after the largest, the time difference is given by subtracting the 50-nanosecond count of the current pulse from the 50-nanosecond count of the pulse that precedes it, resulting in a 13-bit signed value that is positive. For all pulses other than the largest, the fractional amplitude of the pulse is calculated by multiplying the amplitude of the current pulse by 1000, dividing by the amplitude of the largest pulse, and rounding the result off to the nearest integer. This integer is then represented by a 10 bit binary number. A one bit binary flag is used to indicate whether the pulse is due to a CG event ("0") or an IC event ("1"). The 13 bit time difference, 1 bit classification flag, and 10 bit fractional amplitude are concatenated together to generate binary representations 500 in FIG. 19 and their hexadecimal equivalents 502. Therefore, the six pulses of FIG. 16 are represented by the one 88-bit data record 490 of FIG. 18 for the largest amplitude pulse and the five 24-bit data records 500 of FIG. 19 for the five pulses other than the largest. Another optional embodiment of the invention will utilize a 15 bit signed time difference value and an 8 bit fractional amplitude value rather than the 13 bit time difference and 10 bit fractional amplitude alluded to above. Other variations of this 24 bit data record scheme may be utilized to allow tradeoffs between maximum time interval and amplitude resolution.

FIGS. 20A–20D are used to illustrate the compression process according to the invention. In step 504 the position of the largest amplitude is identified. In step 506, the 32-bit time-stamp and 25-bit fifty nanosecond count of the largest pulse are stored. If amplitude fractions are to be used (step 508) in the representation of the other pulses in the pulse train, the amplitude fraction flag bit is set in step 512, otherwise it is cleared in step 510. The 14 bit binary representation of the amplitude of the largest pulse is stored is step 514. If direction information is provided (step 516), a 15 bit binary representation of the azimuth of the largest pulse is generated in step 520, otherwise the binary representation for 359.99 degrees is used in step 518. The process continues in step 522 of FIG. 20B where a flag indicating the type of event is set. A binary "1" indicates an IC event while a "0" indicates a CG event. A "current pulse" pointer is set to the data structure representing the pulse prior to the largest in step 524. A 13-bit value is generated for the time difference between the current pulse and the pulse immediately after it in the pulse train in steps 528 and 530. At step 532, the process determines whether amplitude fractions are being used, and if so, a 10 bit value is generated for the amplitude fraction of the pulse immediately prior to the largest pulse in steps 534 and 536 and the classification bit is set in step 538 of FIG. 20C. The pointer that was initialized in step 524 is then decremented at step 540 and the process loops to step 526 of FIG. 20B until the pointer reaches the beginning of the pulse train.

Figure 20A:
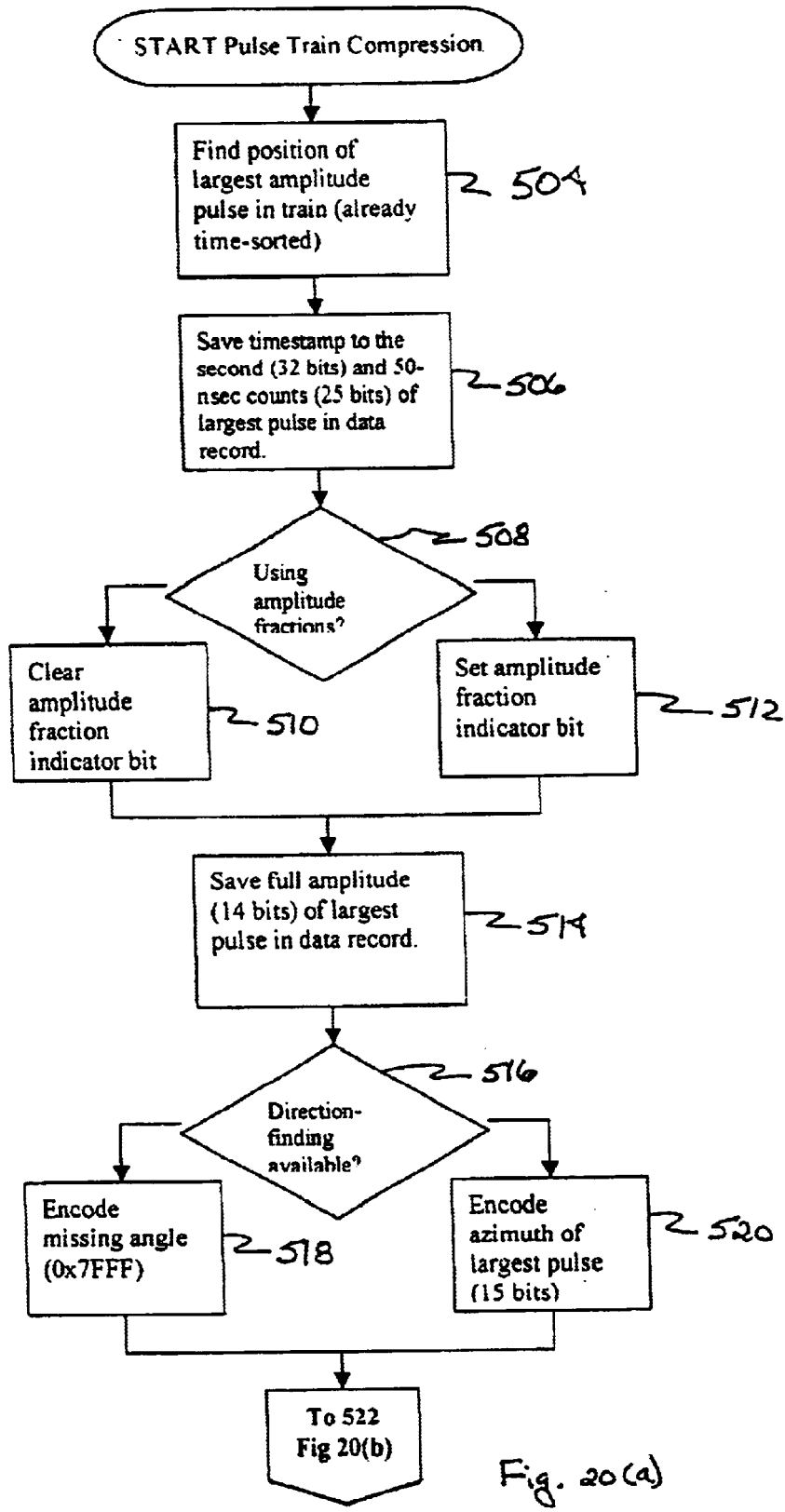
FIGS. 20A–20D are a flowchart illustrating a compression process according to the invention.
Figure 20B:
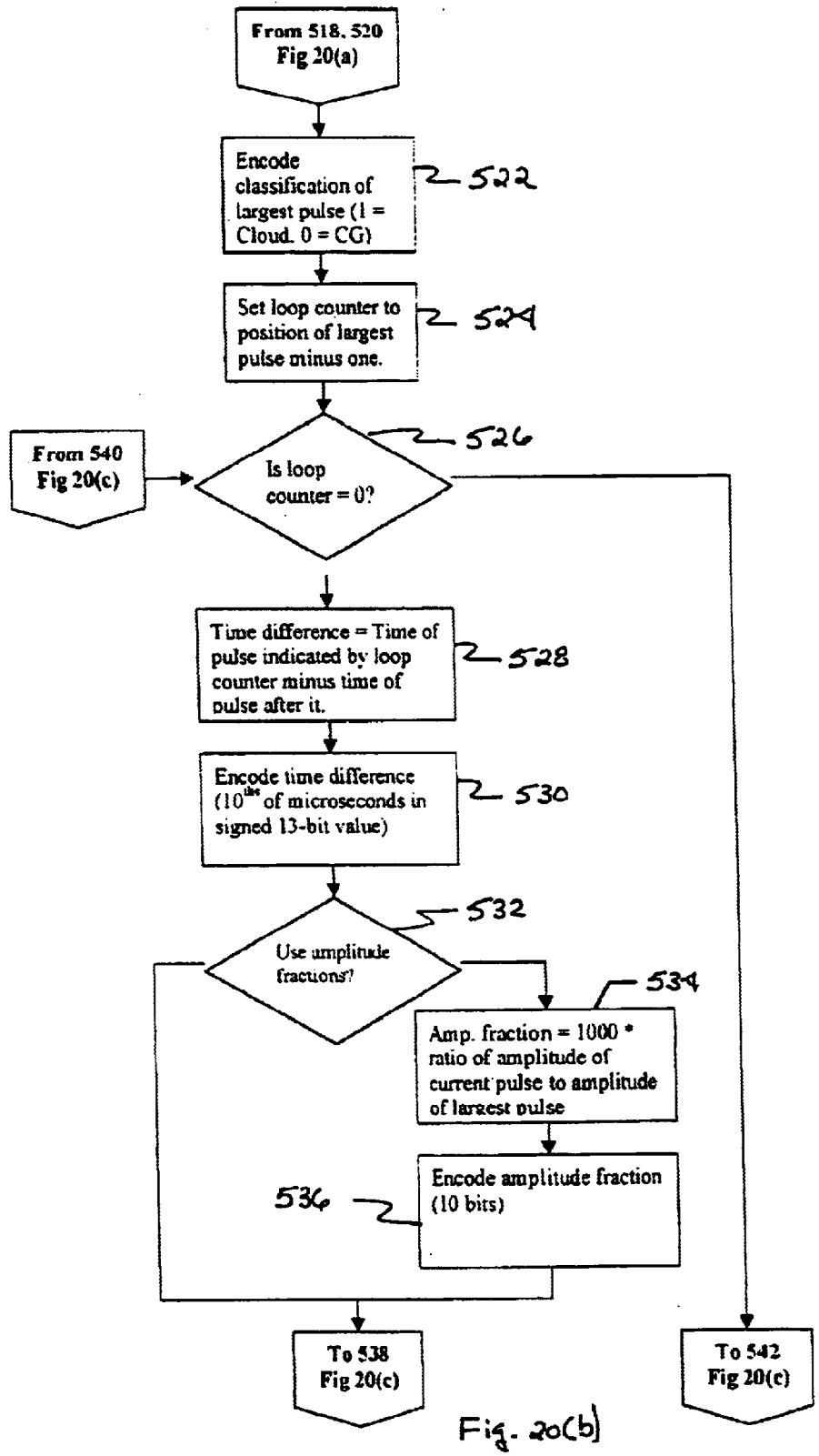
Figure 20C:
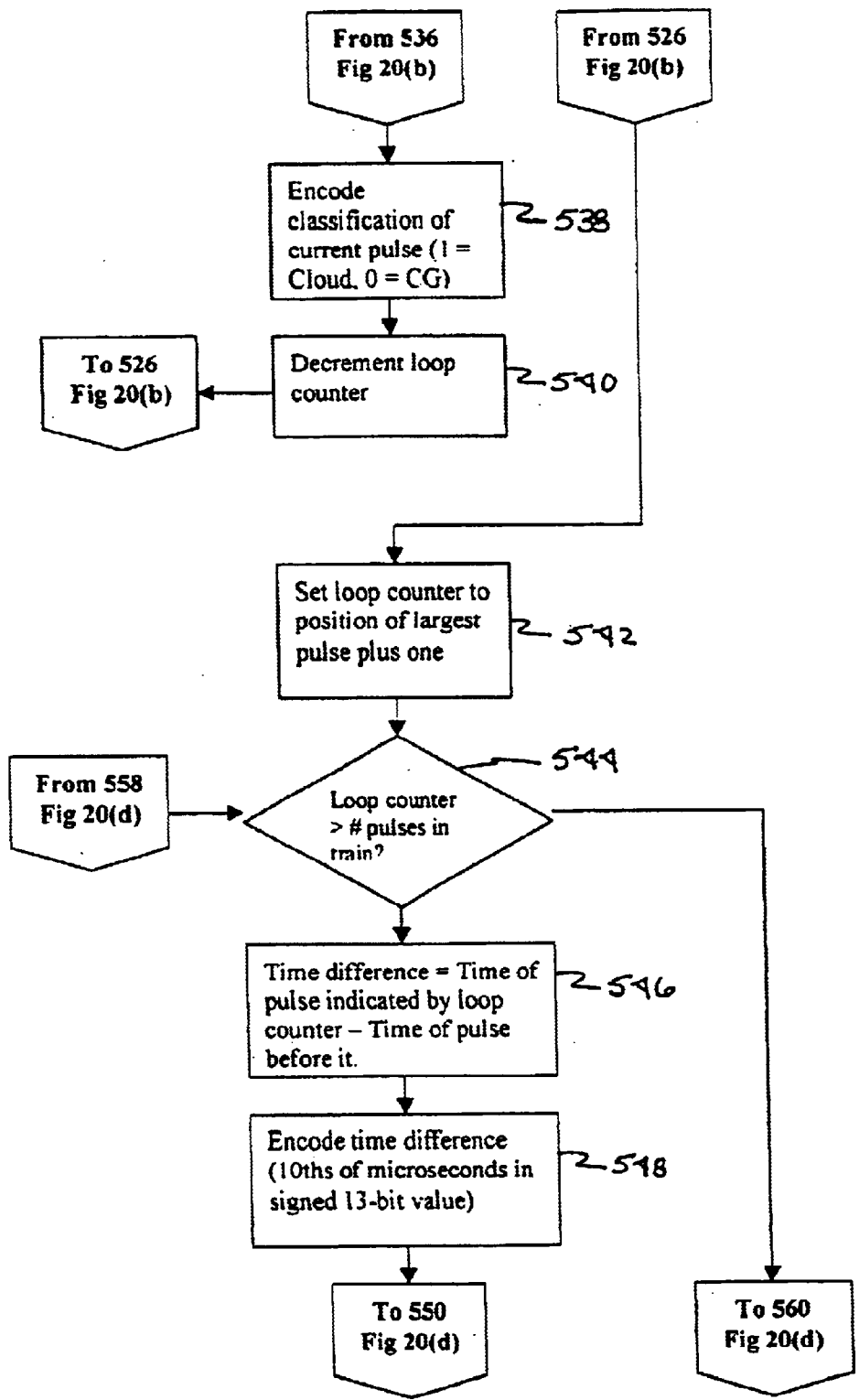
Figure 20D:
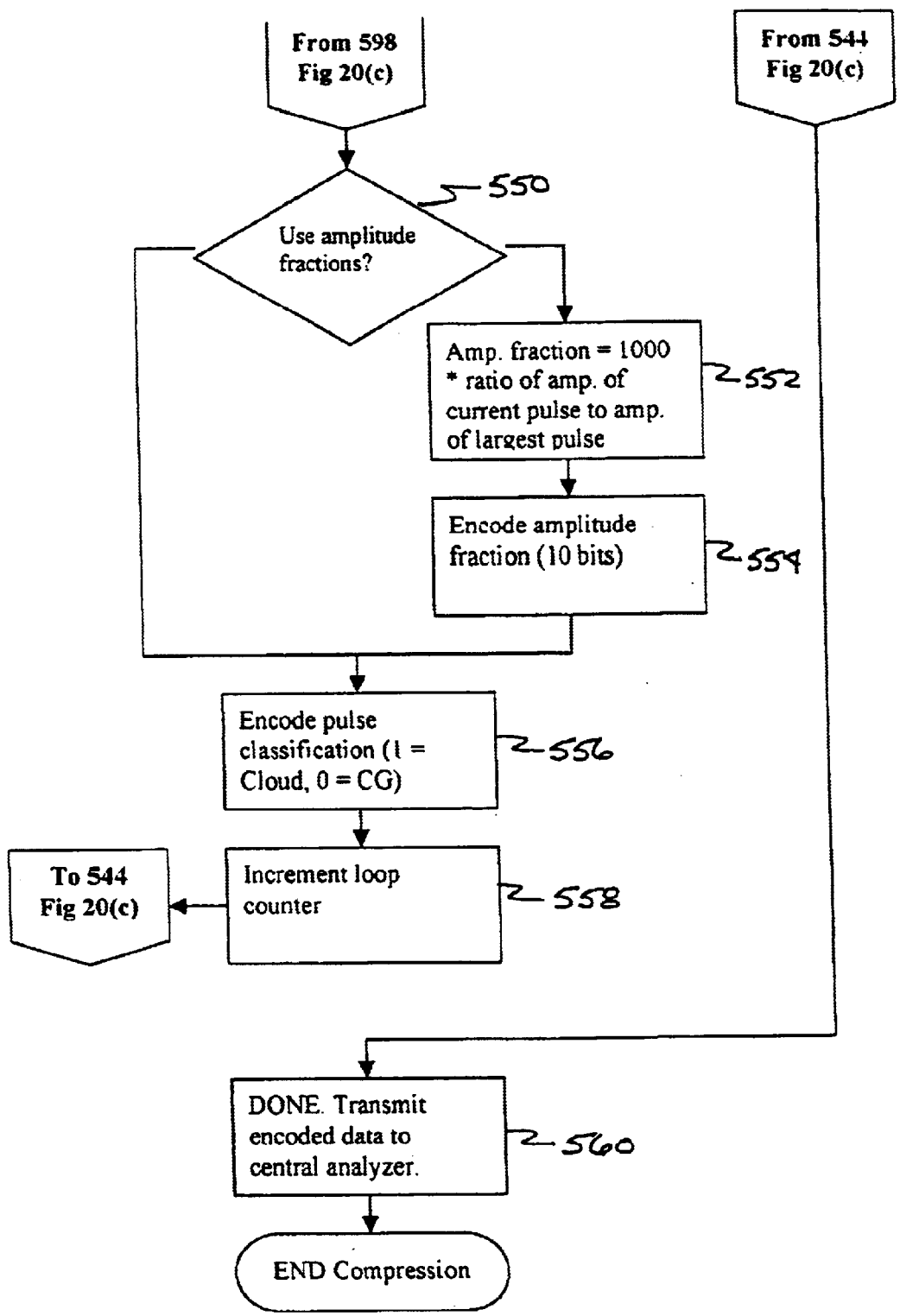

Once the pointer has reached the beginning of the train, indicating that all pulses prior to the largest pulse have been encoded, the pointer is reset to the first pulse after the largest (step 542 of FIG. 20C). A 13-bit value is generated for the time difference between the largest pulse and the pulse prior to it in the pulse train in steps 546 and 548 of FIG. 20C. At step 550 of FIG. 20D, the process determines whether amplitude fractions are being used, and if so, a 10-bit value is generated for the amplitude fraction of the pulse immediately after the largest pulse in steps 552 and 554 and the classification bit is set in step 556 of FIG. 20D. The pointer set in step 542 is then incremented in step 558 and the process loops to step 544 of FIG. 20C until the pointer reaches the end of the pulse train. When this occurs, the information has been compressed according to the invention and is ready to be transmitted to the central analyzer in step 560 of FIG. 20D, at which point the process ends (step 562).

Transmission of information between the remote programmable sensors 12 and the central analyzer 20 occurs as packets or messages. These messages are made up of several 8 bit binary words. The size of the packet is variable with the number of pulses in a pulse train. The more pulses in a pulse train, the larger the message. Each message contains 11 bytes representing the largest pulse in the pulse train. The message also includes another 3 bytes for each additional pulse in the pulse train, if amplitude fractions are being used. If not, the message includes one and three quarter (two in practice) bytes for each additional pulse in the pulse train.

Occasionally, especially in sensors operating in the VHF frequency range, even the compression of pulse trains will be insufficient to allow all pulses to be transmitted over the available communications system in real time. In such situations, the sensor will be capable of selecting portions of the pulses or pulse trains that occur in specific time periods and transmitting those only. More specifically, time is divided into short time periods referenced to the beginning of a second (for example, 50 millisecond periods). In the event of a backup of information in the communications system (as evidenced by data accumulating in an output buffer), data quantity is reduced to the first few events in a collection of these time periods. For example, we may transmit only the first event from each of twenty 50-millisecond periods in one second. This "data decimation" algorithm is synchronized among all sensors in the network by way of the GPS time information, so that all sensors are guaranteed to transmit data corresponding to the same periods of time. Operation of the Central Analyzer is described hereafter.

Data Decompression

Figure 21A:
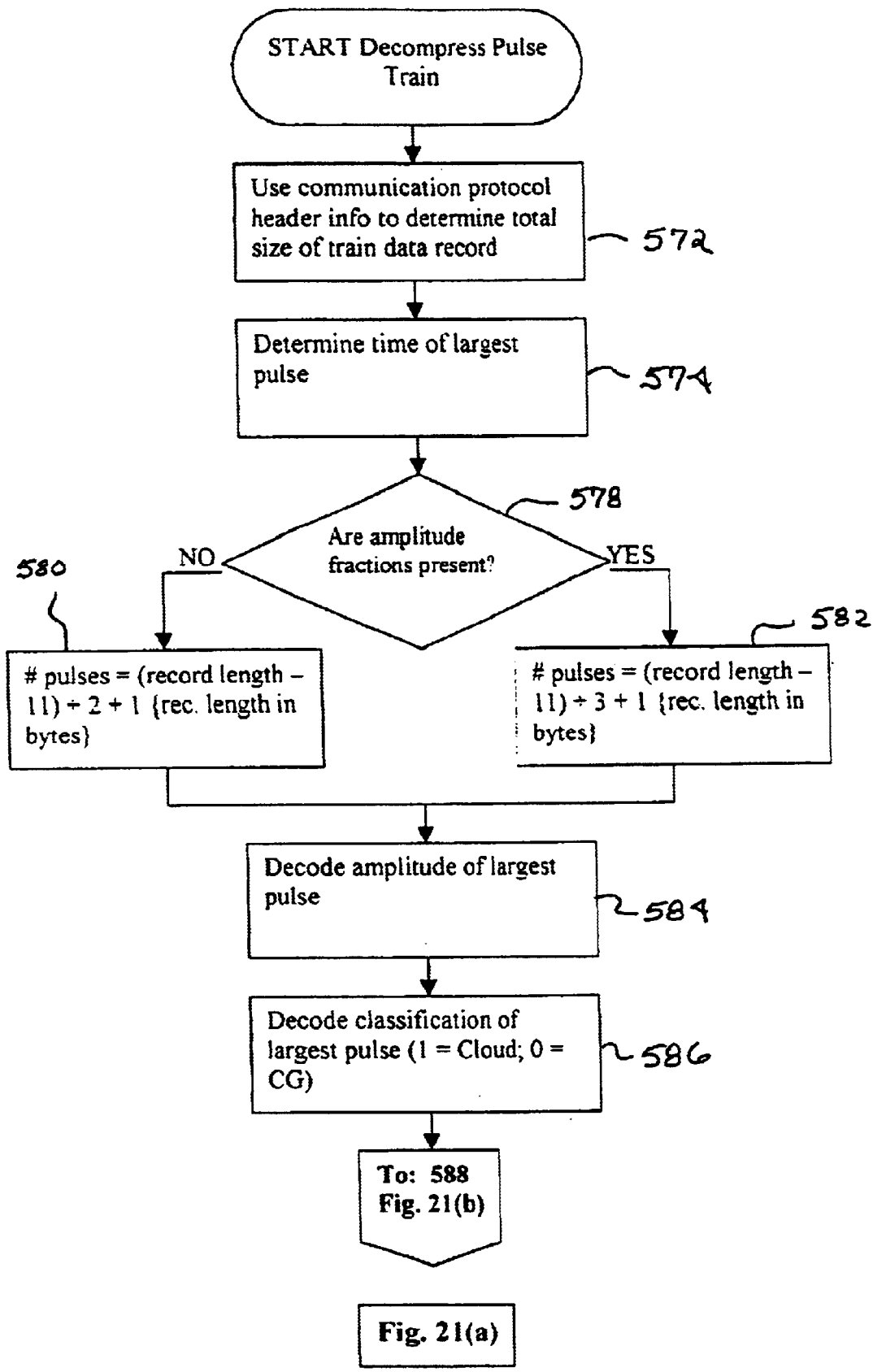
FIGS. 21A–21C are a flowchart illustrating a de-compression process according to the invention.
Figure 21B:
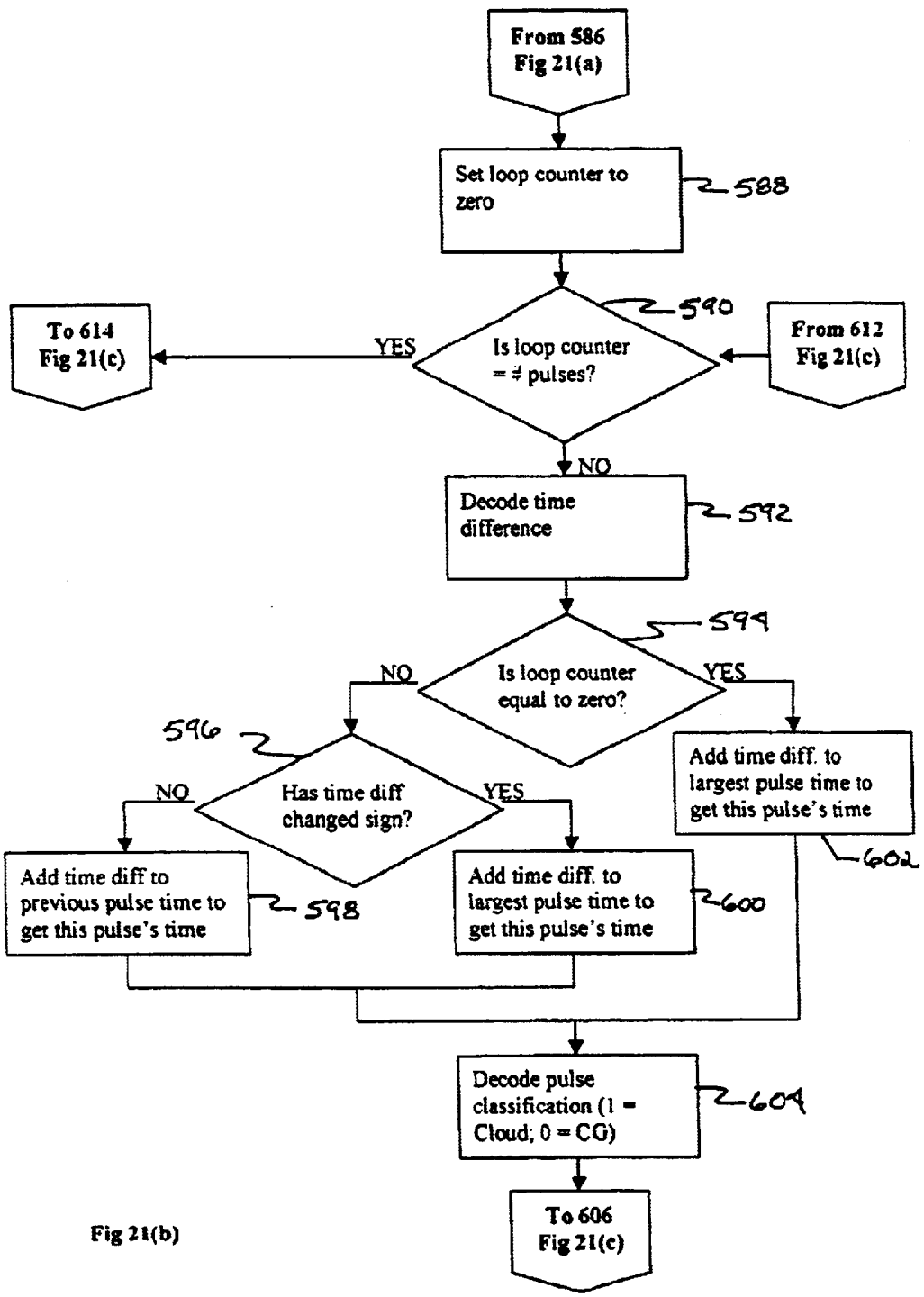
Figure 21C:
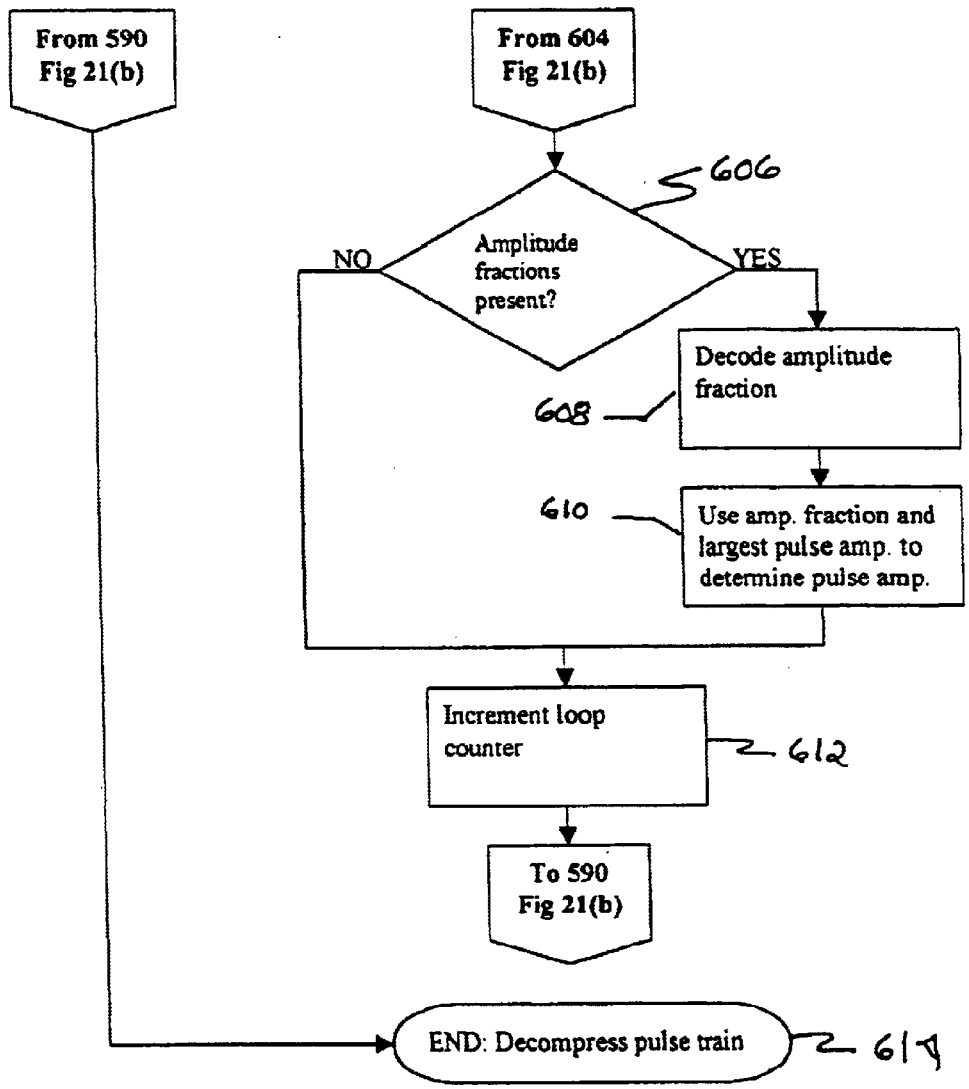

Once the information has been received by the central analyzer, it must be decompressed. The flowchart of FIGS. 21A–21C represents the process necessary to decompress messages received from remote programmable sensors. The number of bytes in the message is determined in step 572 of FIG. 21A. The time-stamp of the largest pulse is extracted from the message in step 574 and the use of amplitude fractions is determined in step 578. The total number of pulses in the message is determined in step 580, if amplitude fractions are not used and step 582 when amplitude fractions are used. This algorithm takes the number of bytes in the entire message determined in step 572 and subtracts eleven words, the number of words necessary to describe the largest amplitude pulse. The result is divided by the number of bytes necessary to represent a compressed pulse, two when amplitude fractions are not used and three when amplitude fractions are used. A quantity of one is added to the quotient to produce the entire number of pulses in the pulse train.

The amplitude of the largest pulse is determined in step 584 and the event classification is determined in step 586. A loop counter is initialized to zero in step 588 of FIG. 21B. The loop is used to step through all remaining pulses in the pulse train. Each signed time difference is extracted from the compressed data stream at step 592 and added to the time stamp of either the largest pulse (step 602 the first time through the loop, as determined in the decision 594, or step 600 when the time difference changes sign as determined in the decision 596) or the time of the most recently decoded pulse (step 598) to generate the absolute time that each pulse occurred. Pulse classification is determined in step 604. Step 606 of FIG. 21C is used to determine whether amplitude fractions are included in the compressed data. If so, the actual amplitude of each pulse is reconstructed in step 608 and 610 of FIG. 21C. The loop counter is incremented at 612, and the process returns to step 590 of FIG. 21B. The loop continues until the loop counter equals the number of pulses determined in step 580 or step 582, indicating that all the pulses in the pulse train have been decompressed. At that point, the process ends at step 614 of FIG. 21C.

Once the information has been decompressed, it is compared with information from other remote programmable sensors 12 to determine the location, amplitude, and time of occurrence of the lightning events. With the increased information allowed by detecting pulse trains produced by the same lightning event, an improved correlation technique is required.

Pulse Correlation

Four pulse trains are illustrated in FIG. 22. A first pulse train 650 is detected by a remote programmable sensor 12 which is nearest to the site of lightning activity as indicated by the earliest time of arrival from the lightning event to the sensor and the large number of pulses (thirteen). A second pulse train 652 is detected by a remote programmable sensor 12 located farther away from the lightning activity than the sensor which produced the first pulse train 650, as indicated by later arrival and fewer (eight) pulses of smaller amplitude. The remote programmable sensor 12 for the third pulse train 654 is located yet farther away from the lightning activity than the sensor producing the second pulse train. The third pulse train 654 has only four pulses whose amplitudes are markedly less than those of the first or second pulse trains. A fourth pulse train 656 is detected by a remotely programmable sensor 12 which is the farthest away from the lightning activity. Only three pulses are evident in this pulse train.

Figures 23, 24:
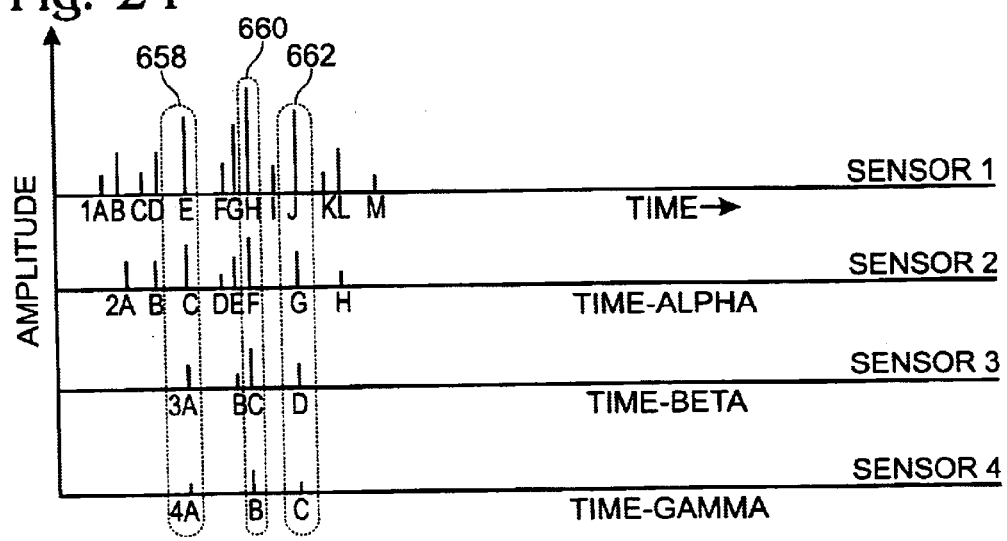
FIG. 23 is a table with the pulses of FIG. 22 sorted by amplitude and sensor location according to the invention.
FIG. 24 is a time-adjusted graph depicting a correlation process according to the invention.

A unique correlation approach, according to the invention, provides high confidence pulse source location using either three remote programmable sensors 12 or two remote programmable sensors 12 with direction information. If no direction information is provided by the remote programmable sensors 12, then a theoretical ideal subset of three sensors is chosen in order to provide an initial TOA-based location. This theoretical set of sensors is used to reduce the set of potential correlated pulses from other sensors. To determine the necessary TOA differences, all the pulses in a time window for each sensor are sorted by decreasing signal amplitude producing the table of FIG. 23. Next, the three sensors having the largest pulses at the top of their amplitude-sorted lists are selected as the ideal subset previously mentioned. This choice is based on the fact that larger amplitude pulses are produced by lightning discharges that are substantially vertical and the largest pulse detected at one sensor is likely to be the largest pulse detected at another sensor. In the example of FIG. 22, the subset includes the remote programmable sensors 12 producing the first pulse train 650, second pulse train 652, and third pulse train 654. These pulse trains were selected from the pulse trains reported by all sensors because they possessed the largest magnitude pulses. The largest pulses from each of the three ideal sensors are 1H, 2F, and 3C as shown in FIG. 23. Using the time differences between these three pulses, an estimated TOA-based location and time of occurrence are determined for the discharge. Next, expected values of the travel times from the estimated discharge position to all sensors are determined and used to adjust the pulse trains in time by subtracting relative time differences alpha, beta, and gamma as shown in FIG. 24. The values of alpha, beta, and gamma used to slide the second pulse train 652, third pulse train 654, and fourth pulse train 656, respectively, are given by the difference between the time it takes the signal to reach each of the associated sensors minus the time taken to reach the first sensor. After adjustment, the times of arrival of the largest amplitude pulses at the first three sensors coincide with pulse 4B of the fourth pulse train 656, as shown by the grouping of pulses 660 in FIG. 24. Likewise, the second largest correlated pulse corresponds with 4C of the fourth pulse train 656, as shown by the grouping 662 in FIG. 24, and finally, the third largest pulse corresponds with 4A of the fourth pulse train 656, as shown by grouping 658. When at least one, and preferably more (as in FIG. 24) inter-pulse time intervals are found to match, the probability of having a proper correlation among the various sensors is very close to 1. If the pulse trains cannot be found to match as in FIG. 24, a different combination of pulses from three sensors from the amplitude-sorted lists in FIG. 23 is used to produce a new estimated discharge location, and the process starts over. This process may be repeated any number of times until pulses are exhausted, although in a preferred embodiment, the process might only be attempted three or four times. This correlation process has the advantage that it also works well in the presence of regularly spaced pulses or pulses of similar amplitude.

An alternative correlation process is used for lightning detection systems having at least 2 sensors with direction finding capability. The correlation process is the same as the method above except angle and time measurements from just two sensors are used to produce an initial estimate of discharge position and time of occurrence, from which the travel time to other sensors can be estimated.

Yet another extension of the correlation process is used to track the travel path of a progression of lightning discharges having a significant horizontal component to their motion. Identifying correlated pulses from different sensors with slightly different inter-pulse time intervals indicates pulse train expansion or contraction caused by horizontal movement of lightning during the production of the pulse train. Either of the first two correlation techniques may be used as long as a greater degree of timing uncertainty is allowed in the fine-scale pulse correlation in order to account for slightly different inter-pulse intervals. If two or three sources can be located then a propagation speed and direction may be estimated. These estimates may then be used to predict the contraction or expansion of pulse trains from other sensors in order to provide a further refinement to the correlation process. This correlation technique is useful to isolate different branches of a lightning discharge. TOA-based locations are determined throughout the processes described in preceding paragraphs, not only to get final, optimized positions in cases when there are more than three TOAs but also to get initial position estimates (start positions).

In view of the foregoing, it can be seen that a system according to the invention provides numerous advantages over prior art lightning detection and analysis systems. First, the system provides the ability to detect both CG and IC events while eliminating dead-time. Second, the remote programmable sensors have increased sensitivity to IC events without being swamped by CG events due to analysis of the differentiated and/or compressed waveform. Third, the system has the ability to transmit increased event information over a limited broadband communication channel to a central analyzer using a novel compression and decompression scheme. Additionally, the system has the ability to correlate events that produce complex pulse trains at the central analyzer using a novel correlation technique, thereby allowing accurate TOA-based locations.

The terms and expressions which have been employed in the foregoing specification are used therein as terms of description and not of limitation, and there is no intention in the use of such terms and expressions of excluding equivalents of the features shown and described or portions thereof it being recognized that the scope of the invention is defined and limited only by the claims which follow.

We claim:

1. A lightning detection system, comprising:
   a plurality of sources of data representative of a pulse train resulting from a lightning flash, said sources having different locations; and
   a central analyzer for receiving and analyzing said data so as to correlate a set of pulses in said pulse train across said sources using only a sub-set of the pulses of said set to produce an estimate of the location and the time of that portion of said lighting flash corresponding to said set of pulses.

2. The lightning detection system of claim 1, wherein said sub-set comprises just one of said pulses.

3. The lightning detection system of claim 2, wherein said central analyzer is adapted to produce said estimate using only a portion of said data corresponding to the minimum number of said sources required for the production of said estimate.

4. The lightning detection system of claim 3, wherein said one of said pulses is the largest amplitude pulse provided by each of said minimum number of sources.

5. The lightning detection system of claim 3, wherein said minimum number of said sources is two when said first portion of said data includes an angle measurement representative of said pulse train provided by each of said two sources.

6. The lightning detection system of claim 3, wherein said minimum number of said sources is three when said first portion of said data includes time-of-arrival measurements representative of said pulse train but does not include an angle measurement representative of said pulse train.

7. The lightning detection system of claim 1, wherein said central analyzer is adapted to shift a portion of said data representative of at least one of said pulses, for each of said sources, in time by an amount determined from said estimate so as to align said portion of said data, determine from the aligned said portion of said data respective time intervals between corresponding pulses at each of said sources, and compare said time intervals across each of said sources to assess the reliability of said correlating.

8. The lightning detection system of claim 7, wherein said central analyzer is adapted to identify said correlating as reliable if at least one of said time intervals compares to within a predetermined maximum error across each of said sources.

9. The lightning detection system of claim 1, wherein said sub-set comprises more than one of said pulses.

10. The lightning detection system of claim 7, wherein said central analyzer is adapted to produce said estimate using only a portion of said data corresponding to the minimum number of said sources required for the production of said estimate.

11. The lightning detection system of claim 10, wherein said minimum number of said sources is two when said first portion of said data includes an angle measurement representative of said pulse train provided by each of said two sources.

12. The lightning detection system of claim 10, wherein said minimum number of said sources is three when said first portion of said data includes time-of-arrival measurements representative of said pulse train but does not include an angle measurement representative of said pulse train.

13. The lightning detection system of claim 12, wherein time-of-arrival differences between said subsets produced by pairs of said three sources are determined by cross-correlation.

14. The lightning detection system of claim 1, wherein each of said sources is adapted for continually processing respective electrical detection signals at said sources representative of the electromagnetic field of said lightning flash so as to eliminate dead time between said pulses.

15. The lightning detection system of claim 14, wherein each of said sources includes a data compression component for reducing the amount of said data, for decreasing the time or bandwidth required to transmit said data from said sources to said central analyzer over a communications channel.

16. The lightning detection system of claim 15, wherein said data compression component is adapted to provide that the reduced said data includes representations of the amplitude and the time of occurrence of the largest amplitude pulse in said pulse train.

17. The detection system of claim 16, wherein said data compression component is adapted to provide that the reduced said data includes representations of the time of occurrence of one or more additional pulses in said pulse train relative to the time of occurrence of a pulse that is adjacent to said one or more additional pulses.

18. The lightning detection system of claim 17, wherein said data compression component is adapted to provide that the reduced said data includes representations of the amplitudes of said one or more additional pulses relative to the amplitude of said largest amplitude pulse.

19. The lightning detection system of claim 15, wherein each of said sources further includes a data decimation component for synchronously decimating said data.

20. The lightning detection system of claim 19, wherein each of said sources is synchronized to a common time reference and, where the rate of production of said data exceeds the data transmission capacity of said communications channel, each of said sources transmits only so much of said data as is representative of a common, periodically recurring time frame of predetermined length.

21. The lightning detection system of claim 14, wherein each of said sources includes a data decimation component for synchronously decimating said data.

22. The lightning detection system of claim 21, wherein each of said sources is adapted to transmit said data to said central analyzer over a communications channel, wherein each of said sources is synchronized to a common time reference and, where the rate of production of said data exceeds the data transmission capacity of said communications channel, each of said sources transmit only so much of said data as is representative of a common, periodically recurring time frame of predetermined length.

23. A lightning detection system, comprising a sensing system comprising a plurality of sensors at different locations for sensing one or more pulses of a lightning flash, each sensor being adapted to measure the time of the sensors' sensing said one or more pulses with reference to a common time reference to produce data representative of said one or more pulses, wherein each of said sensors is adapted for synchronously decimating the data corresponding thereto for decreasing the time or bandwidth required to transmit said data over a communications channel.

24. The lightning detection system of claim 23, wherein, where the rate of production of said data exceeds the data transmission capacity of said communications channel, each of said sensors transmits only so much of said data as is representative of a common, periodically recurring time frame of predetermined length.

25. A method for lightning detection, comprising:
receiving data from a plurality of sources having different locations, said data being representative of a pulse train resulting from a lightning flash; and
analyzing said data so as to correlate a set of pulses in said pulse train across said sources using only a sub-set of the pulses of said set to produce an estimate of the location and the time of that portion of said lightning flash corresponding to said set of pulses.

26. The method of claim 25, wherein said sub-set comprises just one of said pulses.

27. The method of claim 26, further comprising producing said estimate using only a first portion of said data corresponding to the minimum number of said sources required.

28. The method of claim 27, wherein said one of said pulses is the largest amplitude pulse provided by each of said minimum number of sources.

29. The method of claim 27, wherein said minimum number of said sources is two when said first portion of said data includes an angle measurement representative of said pulse train provided by each of said two sources.

30. The method of claim 27, wherein said minimum number of said sources is three when said first portion of said data includes time-of-arrival measurements representative of said pulse train but does not include an angle measurement representative of said pulse train.

31. The method of claim 25, further comprising shifting a portion of said data representative of at least one of said pulses, for each of said sources, in time by an amount determined from said estimate so as to align said portion of said data, determining from the aligned said portion of said data respective time intervals between corresponding pulses at each of said sources, and comparing said time intervals across each of said sources to assess the reliability of said correlating.

32. The method of claim lightning detection system of claim 31, further comprising identifying said correlating as reliable if, by said comparing, at least one of said time intervals compares to within a predetermined maximum error across each of said sources.

33. The method of claim 25, wherein said sub-set comprises more than one of said pulses.

34. The method of claim 33, further comprising producing said estimate using only a first portion of said data corresponding to the minimum number of said sources required.

35. The method of claim 34, wherein said minimum number of said sources is two when said first portion of said data includes an angle measurement representative of said pulse train provided by each of said two sources.

36. The method of claim 34, wherein said minimum number of said sources is three when said first portion of said data includes time-of-arrival measurements representative of said pulse train but does not include an angle measurement representative of said pulse train.

37. The method of claim 36, further comprising determining time-of-arrival differences between said subsets produced by pairs of said three sources by cross-correlation.

38. The method of claim 25, further comprising continually processing respective electrical detection signals at said sources representative of the electromagnetic field of said lightning flash so as to eliminate dead time between said pulses.

39. The method of claim 38, further comprising reducing the amount of said data, for decreasing the time or bandwidth required to transmit said data over a communications channel.

40. The method of claim 39, further comprising providing that the reduced said data includes representations of the amplitude and the time of occurrence of the largest amplitude pulse in said pulse train.

41. The method of claim 40, further comprising providing that the reduced said data includes representations of the time of occurrence of one or more additional pulses in said pulse train relative to the time of occurrence of a pulse that is adjacent to said one or more additional pulses.

42. The method of claim 41, further comprising providing that the reduced said data includes representations of the amplitudes of said one or more additional pulses relative to the amplitude of said largest amplitude pulse.

43. The method of claim 39, further comprising synchronously decimating said data.

44. The method of claim 43, further comprising synchronizing each of said sources to a common time reference and, where the rate of production of said data exceeds the data transmission capacity of said communications channel, transmitting, by each of said sources, only so much of said data as is representative of a common, periodically recurring time frame of predetermined length.

45. The method of claim 38, further comprising synchronously decimating said data.

46. The method of claim 45, wherein each of said sources is adapted to transmit said data to said central analyzer over a communications channel, further comprising synchronizing each of said sources to a common time reference and, where the rate of production of said data exceeds the data transmission capacity of said communications channel, transmitting, by each of said sources, only so much of said data as is representative of a common, periodically recurring time frame of predetermined length.

47. A method for lightning detection, comprising:
providing a plurality of sensors at different locations for sensing one or more pulses of a lightning flash, each sensor being adapted to measure the time of the sensors' sensing said one or more pulses with reference to a common time reference to produce data representative of said one or more pulses; and
synchronously decimating, at each of said sensors, the data corresponding thereto for decreasing the time or bandwidth required to transmit said data over a communications channel.

48. The method of claim 47, wherein, where the rate of production of said data exceeds the data transmission capacity of said communications channel, the method comprises transmitting, by each of said sensors, only so much of said data as is representative of a common, periodically recurring time frame of predetermined length.

* * * * *

UNITED STATES PATENT AND TRADEMARK OFFICE
CERTIFICATE OF CORRECTION

PATENT NO.      : 6,791,311 B2
DATED           : September 24, 2004
INVENTOR(S)     : Mark J. Murphy, Kenneth L. Cummins and Alburt E. Pifer It is certified that error appears in the above-identified patent and that said Letters Patent is hereby corrected as shown below:

Column 19,
Lines 41 and 46, change "said first" to -- said --;
Line 66, change "7" to -- 9 --.

Column 20,
Line 63, change "sources transmit" to -- sources transmits --.

Column 21,
Line 50, change "claim lightning detection system of claim" to -- claim --.

Signed and Sealed this

Nineteenth Day of April, 2005

JON W. DUDAS
*Director of the United States Patent and Trademark Office*